United States Patent
Ohiso et al.

[11] Patent Number: 6,127,200
[45] Date of Patent: Oct. 3, 2000

[54] VERTICAL-CAVITY SURFACE-EMITTING LASER AND METHOD FOR MANUFACTURING THE SAME

[75] Inventors: Yoshitaka Ohiso, Isehara; Yoshio Itoh, Hachioji; Chikara Amano, Atsugi; Yoshitaka Kohama; Kouta Tateno, both of Machida; Hirokazu Takenouchi, Isehara; Takashi Kurokawa, Machida, all of Japan

[73] Assignee: Nippon Telegraph & Telephone Corporation, Tokyo, Japan

[21] Appl. No.: 09/162,235

[22] Filed: Sep. 28, 1998

Related U.S. Application Data

[62] Division of application No. 08/777,975, Dec. 24, 1996, Pat. No. 5,864,575.

[30] Foreign Application Priority Data

Dec. 26, 1995 [JP] Japan ................................... 7-338565

[51] Int. Cl.$^7$ .................................................... H01L 3/025
[52] U.S. Cl. .................................................. 438/46; 438/32
[58] Field of Search .............................. 438/22, 29, 31, 438/32, 46, 47, 455, 507; 372/43, 45, 50, 90

[56] References Cited

U.S. PATENT DOCUMENTS

| | | | |
|---|---|---|---|
| 5,206,871 | 4/1993 | Deppe et al. | 372/72 |
| 5,341,390 | 8/1994 | Yamada et al. | 372/45 |
| 5,343,487 | 8/1994 | Scott et al. | 372/45 |
| 5,432,809 | 7/1995 | Grodzinski et al. | 372/45 |
| 5,493,577 | 2/1996 | Choquette et al. | 372/45 |
| 5,543,638 | 8/1996 | Nettelbladt et al. | 257/98 |
| 5,588,016 | 12/1996 | Otoma et al. | 372/45 |

FOREIGN PATENT DOCUMENTS

| | | | |
|---|---|---|---|
| 06120610 | 4/1994 | European Pat. Off. | 372/96 |
| 406120610 | 4/1994 | Japan | 372/50 |
| 7-335967 | 12/1997 | Japan . | |

OTHER PUBLICATIONS

D.I. Babic et al., "Double fused 1.52 μm Vertical Cavity Lasers", Appl. Phys. Lett., vol. 66, pp. 1030–1032, Feb. 1995.

Babic et al. "Optically pumped all–epitaxial wafer–fused 1.52 μm vertical–cavity lasers", Electronics Letters, pp. 704–705, vol. 30, No. 9, Apr. 28, 1994.

"Double–Fused 1.52–μm Vetical–Cavity Lasers", D. I. Babic and J. J. Dudley, Appl. Phys. Lett., vol. 66 (69), pp. 1030–1032, Feb, 27, 1995.

Patent Abstracts of Japan, vol. 018, No. 406 (E–1585), Jul. 28, 1994 & JP 06–120610 A (Nippon Telegr. & Teleph. Corp.), Apr. 28, 1994, *Abstract.

(List continued on next page.)

*Primary Examiner*—Chandra Chaudhari
*Assistant Examiner*—Keith Christiansa
*Attorney, Agent, or Firm*—Frishauf, Holtz, Goodman, Langer & Chick, P.C.

[57] ABSTRACT

A vertical-cavity surface-emitting semiconductor laser has first and second semiconductor multi-layered films, an active layer, and third and fourth semiconductor multi-layered films which are piled up on a GaAs substrate in that order. Furthermore, the first film is formed by piling up $Al_{x-1}Ga_{1-x1}As$ layers ($0 \leq x1 \leq 1$) and $Al_{x2}Ga_{1-x2}As$ layers ($0 \leq x2 \leq 1$) one after the other by turns. The second film is formed by piling up $In_{x3}Ga_{1-x3}As_{y3}P_{1-y3}$ layers ($0 \leq x3, y3 \leq 1$) and $In_{x4}Ga_{1-x4}As_{y4}P_{1-y4}$ layers ($0 \leq x4, y4 \leq 1$) one after the other by turns. The active layer is provided as an $In_{x5}Ga_{1-x5}As_{y5}P_{1-y5}$ layer ($0 \leq x5, y5 \leq 1$). The third film is formed by piling up $In_{x6}Ga_{1-x6}As_{y6}P_{1-y6}$ layers ($0 \leq x6, y6 \leq 1$) and $In_{x7}Ga_{1-x7}As_{y7}P_{1-y7}$ layers ($0 \leq x7, y7 \leq 1$) one after the other by turns. The fourth film is formed by piling up $Al_{x8}Ga_{1-x8}As$ layers ($0 \leq x8 \leq 1$) and $Al_{x9}Ga_{1-x9}As$ layers ($0 \leq x9 \leq 1$) one after the other by turns. In each film, each layer has a thickness corresponding to a value obtained by dividing an emission wavelength by a refractive index and 4.

8 Claims, 20 Drawing Sheets

OTHER PUBLICATIONS

Dubravko I. Babic et al: "Transverse–mode and polarization characteristics of double–fused 1.52/$\mu$m vertical–cavity lasers" Proceedings of the International Conference on Indium Phosphide and Related Materials, Hokkaido, May 9–13, 1995, No. Conf. 7, May 9, 1995, Institute of Electrical and Electronics Engineers, pp. 773–776.

R. J. Ram et al: "Analysis of wafer fusing for 1.3 $\mu$m vertical cavity surface emitting lasers", Applied Physics Letters, vol. 62, No. 20, May 17, 1993 pp. 2474–2476.

Y. Ohiso et al: "1.55$\mu$m vertical–cavity surface–emitting lasers with wafer–fused InGaAsP/InP–GaAs/AlAs DBRs", Electronics Letters, vol. 32, No. 16, Aug. 1, 1996, pp. 1483–1484.

VERTICAL-CAVITY SURFACE-EMITTING LASER AND METHOD FOR MANUFACTURING THE SAME

This is a division of application Ser. No. 08/777,975 filed Dec. 24, 1996, U.S. Pat. No. 5,864,575.

BACKGROUND OF THE INVENTION

1. Field of the Invention

The present invention relates to a surface emitting semiconductor laser and a method for manufacturing the same. Especially the present invention relates to a vertical-cavity surface-emitting semiconductor laser for long wavelengths (i.e., 1.3 to 1.55 μm) to be used as an optical source for a system of optical communication, optical interconnection, optical data-processing, or the like, in the field of optical data-communication or optical data-processing, and also to a method for manufacturing the novel vertical-cavity surface-emitting semiconductor lasers for long wavelengths.

2. Description of the Related Art

Heretofore, the vertical-cavity surface-emitting lasers (VCSELs) have been investigated and developed as optical sources to be applied in the fields of optical-signal processing, optical-data processing, and so on because of their feasibility of two dimensional high-integration. That is, each of them comprises reflection layers consisting of semiconductor multi-layered films, respectively, and emits light at long wavelengths of 1 to 2 μm that correspond to low-loss wavelengths of a quartz-crystal fiber. Hereinafter, such a kind of the VCSELs will be also simply referred as a long-wavelength VCSEL.

Referring now to FIG. 1, there is shown one of the examples of the conventional long-wavelength VCSELs as described in D. I Babic et al. Appl. Phys. Lett., vol. 66 (69), 1030–1032 (1995).

As shown in the figure, the VCSEL comprises: AlAs/GaAs reflection layers (mirrors) 1, 2 consisting of a plurality of AlAs layers and a plurality of GaAs layers, which are alternatively piled one by one into a stack; and an emission region consisting of InP cladding layers 3, 4 and an active layer 5 positioned between the cladding layers 3, 4. As shown in the figure, furthermore, the emission region is sandwiched between the mirrors 1, 2 and they are directly fused together. That is, the InP cladding layers 3, 4 on both sides of the active layer 5 are directly fused to the AlAs/GaAs mirrors 1, 2, respectively. This kind of direct wafer-fusion between the different semiconductors, such as the GaAs semiconductor and the InP semiconductor, is also disclosed in Japanese Patent Application Laying-open No. 7-335967 (1995).

The reasons for applying the step of direct wafer-fusion between the different semiconductors in the process of manufacturing the long-wavelength VCSEL as described above will be explained below.

A substantially small difference among refractive indexes of semiconductor layers (e.g., InP and InGaAs) of a reflection layer can be observed when the reflection layer is formed using the InP related semiconductor that emits light at a long wavelength, resulting in the difficulty of obtaining a sufficient degree of reflection. Therefore it is necessary to use another reflection layer, for example one made of AlGaAs/GaAs, with a large difference between the refractive indexes of its constituent layers. However it is difficult to grow the Ins semiconductor layer on a GaAs semiconductor (or vice versa). Even if the crystal growth is attained, a crystal defect such as a dislocation extends to a long distance from a growth interface into a growing film. In the case of the direct wafer-fusion, on the other hand, a crystal defect generated on the interface of the fused layers extends in parallel with the interface without entering into the fused layers, so that it reduces the tendency to introduce the crystal defect into the layers. Therefore, a person skilled in the art uses a structure prepared by forming an emission region using the InP semiconductor and fusing it with a highly-reflective GaAs reflection layer.

However, in spite of no observable macroscopic defect such as a dislocation in the active layer 5 of the above VCSEL, an emitting efficiency of the active layer 5 decreases as it were caused by a point defect. Therefore, the conventional VCSELs should be improved because of the following points (I) to (III).

(I) In the conventional surface-emitting laser described above, its laser characteristics including a threshold of current density for laser oscillation deteriorate as a result of causing a recombination center in the active layer which may be dependent on a point defect to be generated at the time of forming cladding layers 3, 4 as thin films so as to lessen the space between the active layer and the fused interface. For preventing the deterioration of the laser characteristics, on the other hand, there is an idea of forming the cladding layer 3, 4 thicker so as to open up the space between the fused interface and the active layer 5. In this case, however, there is a problem of increasing a threshold of current density for laser oscillation as a result of increasing the degree of optical loss in the cladding layers 3, 4.

(II) It is difficult to know an oscillation wavelength before direct wafer-fusing between different-typed substrates in the process of manufacturing the conventional VCSEL. Therefore, the person skilled in the art cannot adjust the observed oscillation wavelength to a predetermined one by repeating the steps of detecting the oscillation wavelength immediately after growing the emission region or the mirror layers 1, 2 and regulating the condition of growing the cladding layers 3, 4 according to the results of the detection. In the conventional VCSEL, accordingly, there is another problem of the difficulty in a precise regulation of the oscillation wavelength.

For widely distributed wavelengths of a gain spectrum in the active layer, an emission wavelength of the VCSEL is dependent on an optical phase shift per a reciprocating motion in a resonator with taking into account by the phase shift by the reflection layers 1, 2 as is the case with the distributed feedback waveguide laser. That is, an oscillation of the VCSEL can occur at a wavelength (i.e., a resonance mode) by which the sum of the following (1), (2), (3) is equal to an integral multiple of 2π: (1), the phase difference between an input light and an output light of the reflection layer 1; (2) the phase difference between an input light and an output light of the reflection layer 2; and (3) a phase shift to be caused in a reciprocating motion of the light in the emission region which is sandwiched between the reflection layers 1, 2. Therefore, the oscillation wavelength of the conventional VCSEL can be determined after the step of wafer-fusion in which the reflection layers 1, 2 are fused with the emission region. It means that it is very difficult to know the oscillation wavelength of the conventional VCSEL before performing the wafer-fusion.

(III) For preparing a buried hetero-structure for simultaneously attaining current confinement into the active layer 5 and a lateral signal mode oscillation, it is required to etch to some midpoint of the InP cladding layer 4 under the active layer 5. However there is the difficulty of controlling a depth of the etch at constant. As a result, a structure of the buried layer is hardly formed to the predetermined design. In addition, a large leakage current occurs as a result of the improperly buried layer structure, and also the yields thereof decline.

Accordingly, the conventional VCSEL having the above problems is not a suitable light source of any one of the systems such as optical interconnection and optical data-processing systems that use a low threshold current (i.e., a low power consumption) and optical communication systems that require a precisely-controlled long wavelength. Even though there has been required a novel VCSEL to be driven at a low threshold current and to be precisely-controlled so as to have a predetermined emission wavelength in a long wavelength band as a communication wavelength band, the prior art has not arrived at a solution of the above problems because of many difficulties depending on the conventional device structure described above.

SUMMARY OF THE INVENTION

Therefore, a first object of the invention is to provide a novel vertical-cavity surface-emitting laser (VCSEL) and its fabrication method, in which the optical loss due to the cladding layer 3, 4 does not increase even if the distance between the fused interface and the active layer 5 is comparatively extended. According to the novel construction of the VCSEL, the distance between the fused interface and the active layer 5 can be properly extended, so that there is no possibility of extending a crystal defect to be caused in the fused interface to the active layer. In addition, the VCSEL with a low threshold can be prepared because of a small effective cavity length, which results in low optical loss.

A second object of the present invention is to provide a novel vertical-cavity surface-emitting laser (VCSEL) and its fabrication method, in which an emission wavelength thereof can be controlled precisely as a result of measuring the emission wavelength before the step of wafer-fusing between the reflection layer and the emission region.

A third object of the present invention is to provide a novel vertical-cavity surface-emitting laser (VCSEL) and its fabrication method, permitting a buried hetero-structure thereof to be formed to the predetermined design.

In a first aspect of the present invention, there is provided a vertical-cavity surface-emitting semiconductor laser, comprising:

a first semiconductor multi-layered film formed by piling up a plurality of $Al_{x1}$-$Ga_{1-p1}As$ layers ($0 \leq x1 \leq 1$) and a plurality of $Al_{x2}Ga_{1-x2}As$ layers ($0 \leq x2 \leq 1$) one after the other by turns, in which each layer has a thickness corresponding to a value obtained by dividing an emission wavelength by a refractive index and 4;

a second semiconductor multi-layered film formed by piling up a plurality of $In_{x3}Ga_{1-x3}As_{y3}P_{1-y3}$ layers ($0 \leq x3$, $y3 \leq 1$) and a plurality of $In_{x4}Ga_{1-x4}As_{y4}P_{1-y4}$ layers ($0 \leq x2$, $y4 \leq 1$) one after the other by turns, in which each layer has a thickness corresponding to a value obtained by dividing an emission wavelength by a refractive index and 4;

an active layer having an $In_{x5}Ga_{1-x5}As_{y5}P_{1-y5}$ layer ($0 \leq x5$, $y5 \leq 1$);

a third semiconductor multi-layered film formed by piling up a plurality of $In_{x6}Ga_{1-x6}As_{y6}P_{1-y6}$ layers ($0 \leq x6$, $y6 \leq 1$) and a plurality of $In_{x7}Ga_{1-x7}As_{y7}P_{1-y7}$ layers ($0 \leq x7$, $y7 \leq 1$) one after the other by turns, in which each layer has a thickness corresponding to a value obtained by dividing an emission wavelength by a refractive index and 4; and a fourth semiconductor multi-layered film formed by piling up a plurality of $Al_{x8}Ga_{1-x8}As$ layers ($0 \leq x8 \leq 1$) and a plurality of $Al_{x9}Ga_{1-x9}As$ layers ($0 \leq x9 \leq 1$) one after the other by turns, in which each layer has a thickness corresponding to a value obtained by dividing an emission wavelength by a refractive index and 4, wherein the first semiconductor multi-layered film, the second semiconductor multi-layered film, the active layer, the third semiconductor multi-layered film, and the fourth semiconductor multi-layered film are piled up on a GaAs substrate in that order.

Here, the first semiconductor multi-layered film may further comprise a plurality of $Al_{x10}Ga_{1-x10}As$ layers ($0 \leq x10 \leq 1$) in a manner that each $Al_{x10}Ga_{1-x10}As$ layer is thinner than the $Al_{x1}Ga_{1-x1}As$ layer and the $Al_{x2}Ga_{1-x2}As$ layer and is provided between the $Al_{x1}Ga_{1-x1}As$ layer and the $Al_{x2}Ga_{1-x2}As$ layer.

The fourth semiconductor multi-layered film may further comprise a plurality of $Al_{x11}Ga_{1-x11}As$ layers ($0 \leq x11 \leq 1$) in a manner that each $Al_{x11}Ga_{1-x11}As$ layer is thinner than the $Al_{x8}Ga_{1-x8}As$ layer and the $Al_{x9}Ga_{1-x9}As$ layer and is provided between the $Al_{x8}Ga_{1-x8}As$ layer and the $Al_{x9}Ga_{1-x9}As$ layer.

The second semiconductor multi-layered film may comprise at least one high-resistance portion as an insulation layer formed by an ion-injection.

Each of the second semiconductor multi-layered film and the third semiconductor multi-layered film may comprise a conductive portion as a conductive layer formed by an ion-injection.

A vertical-cavity surface-emitting semiconductor laser may further comprise:

a mesa structure formed by etching down from the fourth semiconductor multi-layered film to a predetermined point of the second semiconductor multi-layered film; and a buried hetero-structure formed on the mesa structure, wherein the buried hetero-structure is prepared by growing a semiconductor selected from a group of InP and other semiconductors that have lattice constants matching with that of InP.

A vertical-cavity surface-emitting semiconductor laser may further comprise at least one layer selected from a group of:

a $In_{x12}Al_{x13}Ga_{1-x12-x13}As$ layer ($0 \leq x12$, $x13 \leq 1$) is formed between the second semiconductor multi-layered film and the active layer; and a $In_{x12}Al_{x13}Ga_{1-x12-x13}As$ layer ($0 \leq x12$, $x13 \leq 1$) formed between the third semiconductor multi-layered film and the active layer, wherein the selected layer includes an oxidized portion.

A vertical-cavity surface-emitting semiconductor laser may further comprise at least one layer selected from a group of:

a cladding layer consisting of $In_{x14}Ga_{1-x14}As_{1-y14}P_{1-y14}$ ($0 \leq x14$, $y14 \leq 1$) formed between the active layer and the first semiconductor multi-layered film; and a cladding layer consisting of $In_{x14}Ga_{1-x14}As_{1-y14}P_{1-y14}$ ($0 \leq x14$, $y14 \leq 1$) between the active layer and the second semiconductor multi-layered film.

A vertical-cavity surface-emitting semiconductor laser may comprise:
 a dielectric multi-layered film in place of the forth semiconductor multi-layered film.

The active layer may have a multiple-quantum-well structure.

In a second aspect of the present invention, there is provided a method of manufacturing a vertical-cavity surface-emitting semiconductor laser, comprising the steps of:
 growing a first semiconductor multi-layered film on a first GaAs substrate;
 growing a second semiconductor multi-layered film, an active layer, and a third semiconductor multi-layered film on an InP substrate in that order;
 growing a fourth semiconductor multi-layered film on a second GaAs substrate in that order;
 fusing the first semiconductor multi-layered film with the second semiconductor multi-layered film under heat and pressure, followed by removing the InP substrate; and
 fusing the third semiconductor multi-layered film with the fourth semiconductor multi-layered film under heat and pressure, followed by removing the second GaAs substrate, wherein
 the first semiconductor multi-layered film is by piling up a plurality of $Al_{x-1}Ga_{1-x1}As$ layers ($0 \leq x1 \leq 1$) and a plurality of $Al_{x2}Ga_{1-x2}As$ layers ($0 \leq x2 \leq 1$) one after the other by turns, in which each layer has a thickness corresponding to a value obtained by dividing an emission wavelength by a refractive index and 4;
 the second semiconductor multi-layered film is formed by piling up a plurality of $In_{x3}Ga_{1-x3}As_{y3}P_{1-y3}$ layers ($0 \leq x3$, $y3 \leq 1$) and a plurality of $In_{x4}Ga_{1-x4}As_{y4}P_{1-y4}$ layers ($0 \leq x2$, $y4 \leq 1$) one after the other by turns, in which each layer has a thickness corresponding to a value obtained by dividing an emission wavelength by a refractive index and 4;
 the active layer is formed at least from an $In_{x5}Ga_{1-x5}As_{y5}P_{1-y5}$ layer ($0 \leq x5$, $y5 \leq 1$);
 the third semiconductor multi-layered film is formed by piling up a plurality of $In_{x6}Ga_{1-x6}As_{y6}P_{1-y6}$ layers ($0 \leq x6$, $y6 \leq 1$) and a plurality of $In_{x7}Ga_{1-x7}As_{y7}P_{1-y7}$ layers ($0 \leq x7$, $y7 \leq 1$) one after the other by turns, in which each layer has a thickness corresponding to a value obtained by dividing an emission wavelength by a refractive index and 4; and
 the fourth semiconductor multi-layered film is formed by piling up a plurality of $Al_{x8}Ga_{1-x8}As$ layers ($0 \leq x8 \leq 1$) and a plurality of $Al_{x9}Ga_{1-x9}As$ layers ($0 \leq x9 \leq 1$) one after the other by turns, in which each layer has a thickness corresponding to a value obtained by dividing an emission wavelength by a refractive index and 4.

Here, the step of growing the first semiconductor multi-layered film on the GaAs substrate may further include a step of forming an $Al_{x10}Ga_{1-x10}As$ layer ($0 \leq x10 \leq 1$) between the $Al_{x1}Ga_{1-x1}As$ layer and the $Al_{x2}Ga_{1-x2}As$ layer, in which the $Al_{x10}Ga_{1-x10}As$ layer is thinner than the $Al_{x1}Ga_{1-x1}As$ layer and the $Al_{x2}Ga_{1-x2}As$ layer.

The step of growing the fourth semiconductor multi-layered film on the second GaAs substrate may further include a step of forming a $Al_{x11}Ga_{1-x11}As$ layer ($0 \leq x11 \leq 1$) between the $Al_{x8}Ga_{1-x8}As$ layer and the $Al_{x8}Ga_{1-x8}As$ layer, in which the $Al_{x11}Ga_{1-x11}As$ layer is thinner than the $Al_{x8}Ga_{1-x8}As$ layer and the $Al_{x8}Ga_{1-x8}As$ layer.

Prior to remove the InP substrate, at least one high-resistance portion as an insulation layer may be formed in at least one selected from a group of the second semiconductor multi-layered film and the third semiconductor multi-layered film by an ion-injection.

Prior to fuse the third semiconductor multi-layered film with the fourth semiconductor multi-layered film, at least one conductive portion as a conductive layer may be formed in each of the second semiconductor multi-layered film and the second semiconductor multi-layered film by an ion-injection.

After removing the second GaAs substrate, a mesa structure may be formed by etching down from the fourth semiconductor multi-layered film to a predetermined point of the second semiconductor multi-layered film; and
 a buried hetero-structure is formed on the mesa structure by growing a semiconductor selected from a group of InP and other semiconductors that have lattice constants matching with that of InP.

Prior to remove the InP substrate, a first $In_{x12}Al_{x13}Ga_{1-x12-x13}As$ layer ($0 \leq x12$, $x13 \leq 1$) may be formed between the second semiconductor multi-layered film and the active layer and a second $In_{x12}Al_{x13}Ga_{1-x12-x13}As$ layer ($0 \leq x12$, $x13 \leq 1$) is formed between the third semiconductor multi-layered film and the active layer, and
 after forming a mesa structure, an oxidized portion is formed in the first and second $In_{x12}Al_{x13}Ga_{1-x12-x13}As$ layers.

A cladding layer consisting of $In_{x14}Ga_{1-x14}As_{1-y14}P_{1-y14}$ ($0 \leq x14$, $y14 \leq 1$) may be formed at least one interface selected from a group of an interface between the active layer and the first semiconductor multi-layered film and an interface between the active layer and the second semiconductor multi-layered film.

DETAILED DESCRIPTION OF PREFERRED EMBODIMENTS

1st Embodiment

Figure 1:
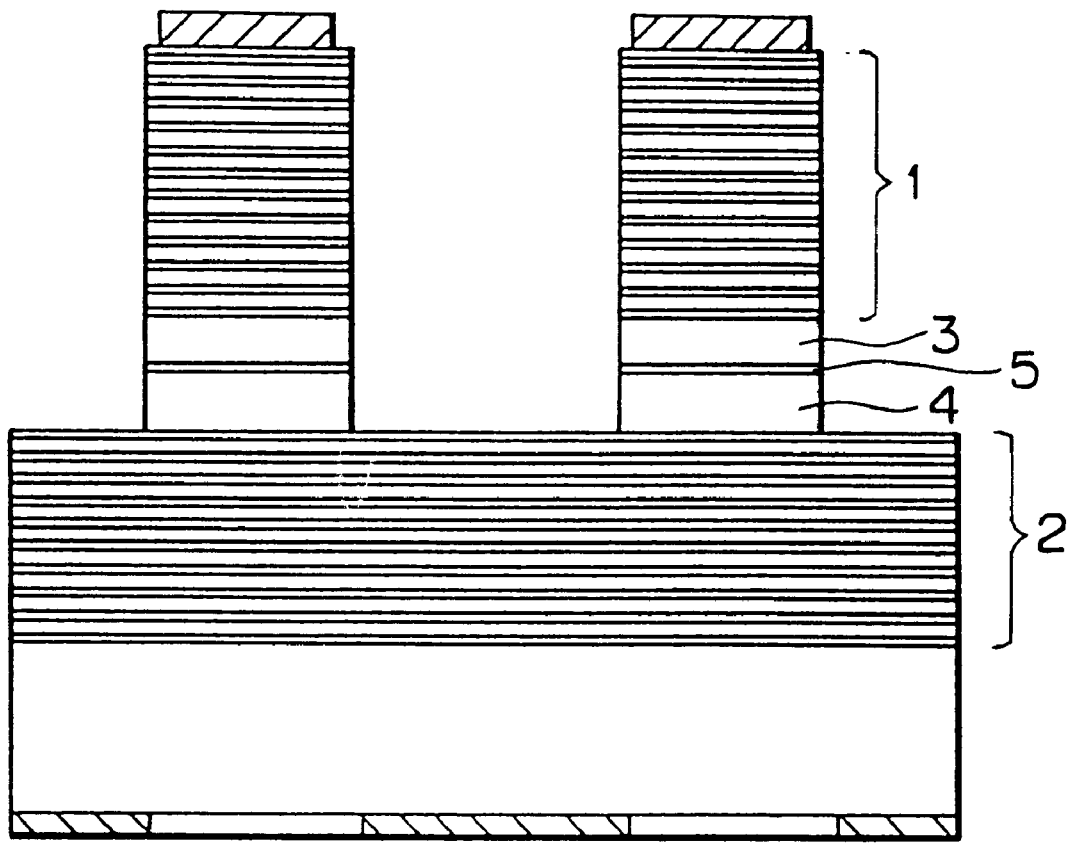
FIG. 1 is a schematic sectional view of one of the examples of the conventional long-wavelength VCSELs.
Figure 2:
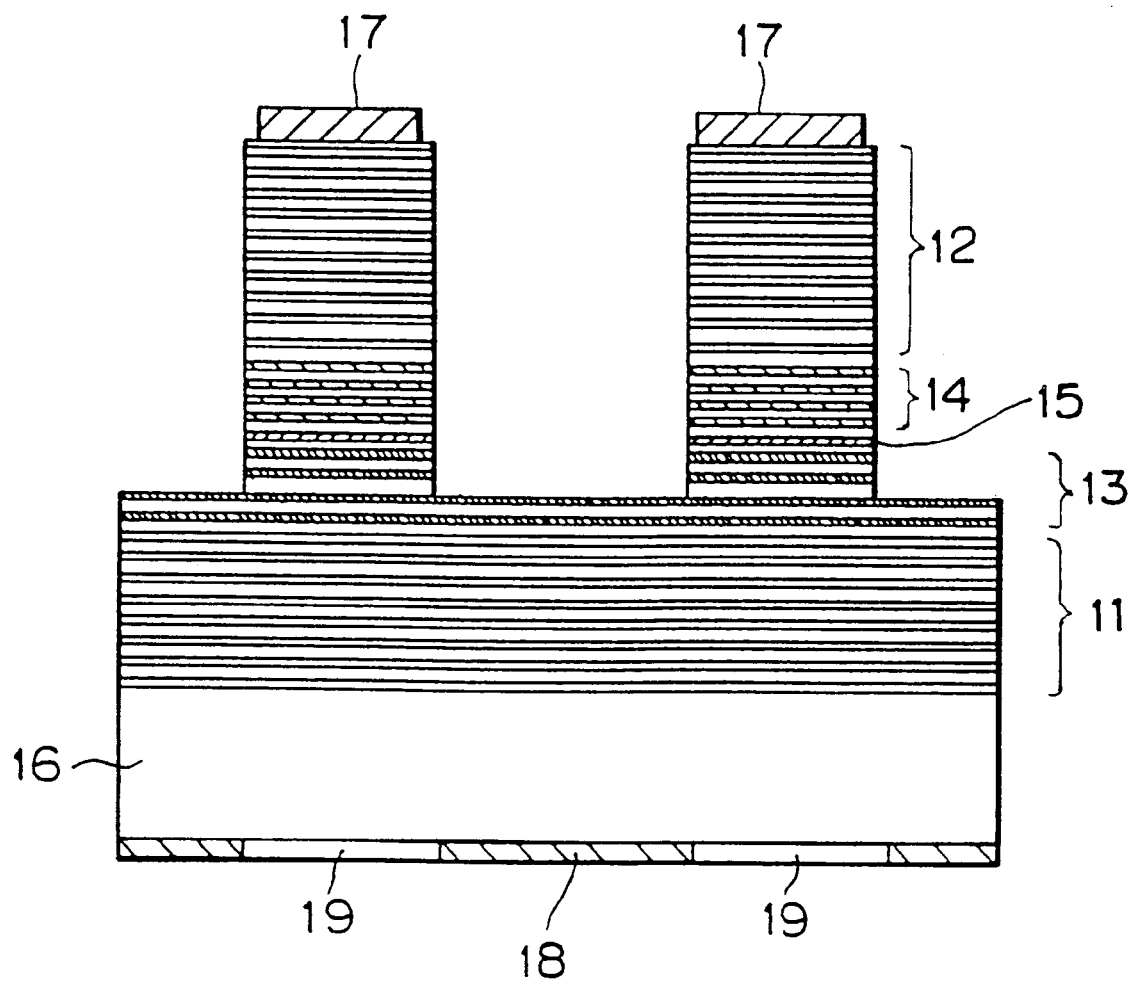
FIG. 2 is a schematic sectional view of one of the preferred embodiments of the long-wavelength VCSELs in accordance with the present invention.

FIG. 2 is a schematic sectional view of one of the preferred embodiments of the vertical-cavity surface-emitting lasers (VCSELs) in accordance with the present invention.

A VCSEL consists of a plurality of stacked layers on a GaAs substrate 16. As shown in the figure, electrodes 18 and anti-reflection (AR) films 19 are provided on one surface (i.e., a bottom surface) of the GaAs substrate 16, while on the other side thereof there are stacked a first semiconductor layer (an AlGaAs/AlGaAs reflection layer) 11, a second semiconductor layer (an InGaAsP/InGaAsP reflection layer) 13, an active layer 15, a third semiconductor layer (InGaAsP/InGaAsP reflection layer)14, and a fourth semiconductor layer (AlAs/AlGaAs reflection layer)12 in that order. A mesa structure is formed by etching down an upper surface of the top layer (i.e., the AlGaAs/AlGaAs reflection layer 12) to a certain point of the InGaAsP/InGaAsP reflection layer 13. In this structure, furthermore, electrodes 17 are provided on the upper surface of the AlGaAs/AlGaAs reflection layer 12.

In the above construction, an emission region is constructed of the InGaAsP/InGaAsP reflection layers 13, 14 and the active layer 15. These layers 13, 14, 15 can be grown on the InP substrate, so that a fusion-interface can be formed between the InGaAsP/InGaAsP reflection layers 13 and the AlGaAs/AlGaAs reflection layer 11, and also another fusion-interface can be formed between the InGaAP/InGaAsP reflection layer 14 and the AlGaAs/AlGaAs reflection layer 12. This fact allows a longer distance between the active layer and each of the fusion-interfaces without increasing a cavity length, resulting in good crystallinity of the active layer 15. Then, a threshold current becomes low.

As previously stated, the active layer 15 can be grown on the same substrate together with the InGaAsP/InGaAsP reflection layers 13, 14, so that it allows a measurement of oscillation wavelength before fusing the emission region with the substrate having the AlGaAs/AlGaAs reflection layer 11 or 12 thereon. Although, only the InGaAsP/InGaAsP reflection layer hardly attains the reflective index of 99% or more, the resonant modes can be determined at the time of after forming the InGaAsP/InGaAsP reflection layers on the top and bottom sides of the active layer 15, respectively.

In the above construction, the InGaAsP/InGaAsP reflection layer 13 under the active layer 15 is provided, so that it becomes possible to increase an acceptable depth of etching at the time of forming the buried hetero-structure and also it can be performed in conjunction with a selectable chemical etching. As a result, the etching depth can be easily regulated uniformly and it becomes possible to increase the yields at the time of forming the buried hetero-structure, dramatically.

In the above VCSELs, reflection layers are described as multi-layers made from InGaAsP or AlGaAs. However, the InGaAsP/InGaAsP reflection layer does not mean not only multi-layer made from quarternary alloys but also that made from InGaAsP and InP. In the same way, AlGaAs/AlGaAs reflection layer does not mean not only multi-layer made from ternary alloys but also that made from AlAs and GaAs.

Hereinafter, we will describe one of examples of manufacturing the vertical-cavity surface-emitting laser having the construction described above.

Figure 3A:
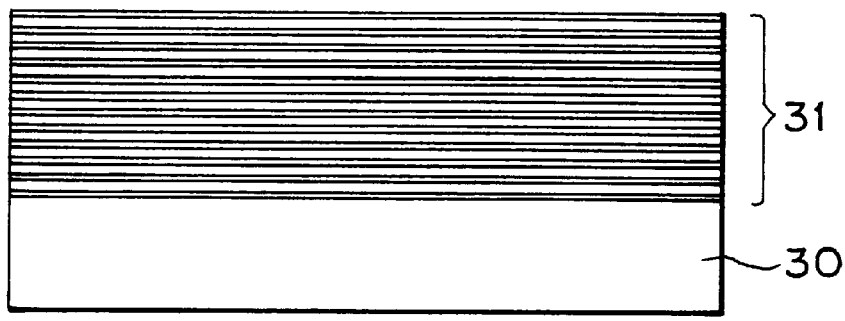
FIGS. 3A to 3C are schematic sectional views of epitaxial structures for explaining the steps of the process for manufacturing the first preferred embodiments of the long-wavelength VCSELs in accordance with the present invention.
Figure 3B:
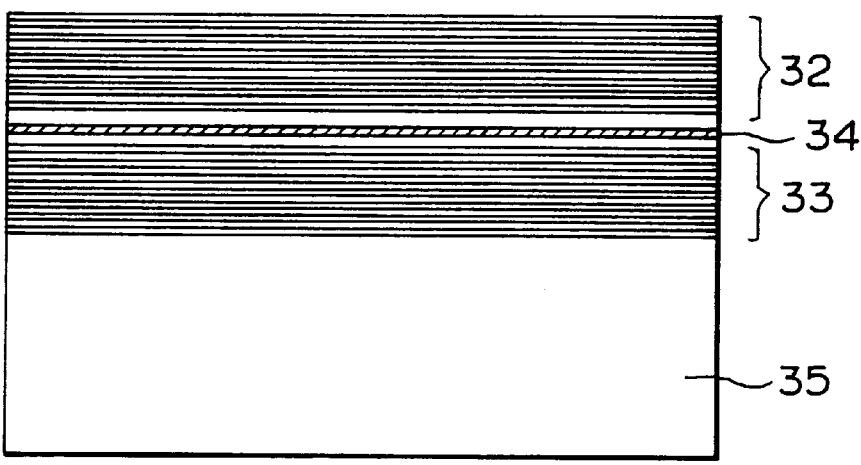
Figure 3C:
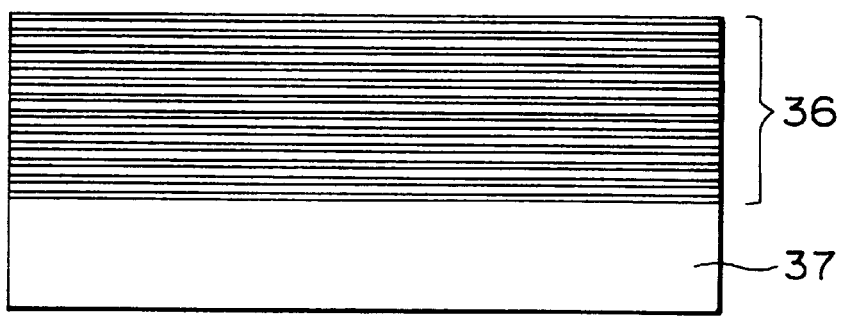
Figure 4A:
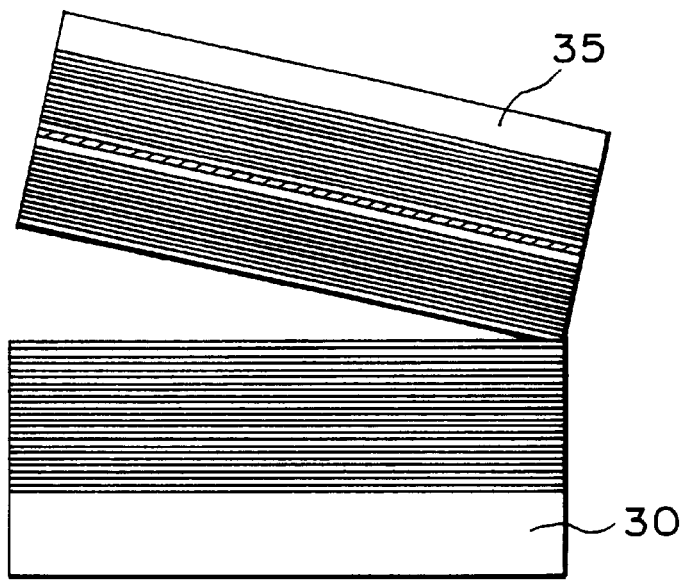
FIGS. 4A and 4B are schematic sectional views of wafer-fused structures among epitaxial structures of FIGS. 3A to 3C.
Figure 4B:
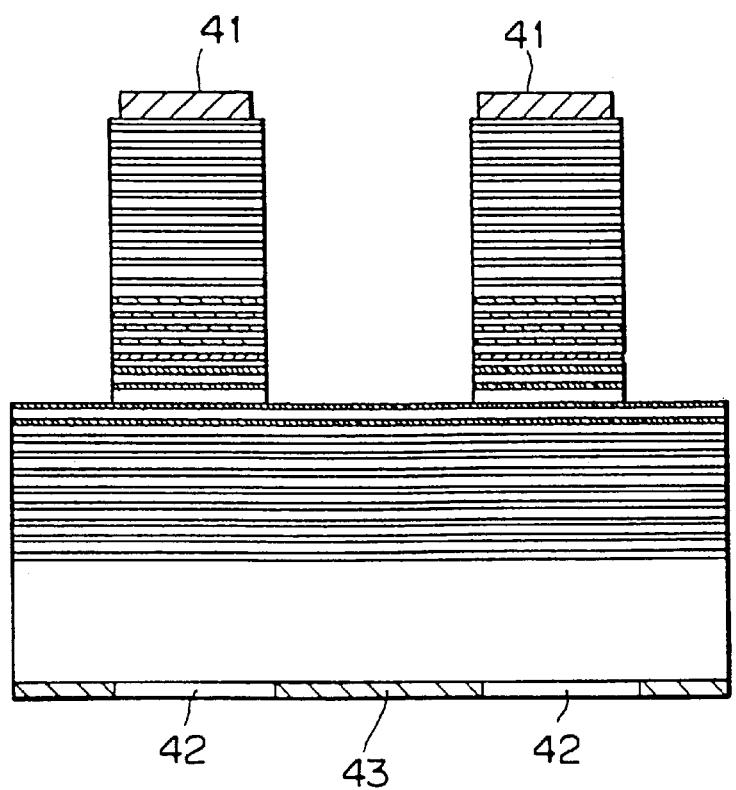

FIGS. 3A to 3C are cross-sectional views of three epitaxial structures and FIGS. 4A and 4B are cross-sectional views of wafer-fused structure for explaining the process for manufacturing the VCSEL of the present embodiment.

By the first step, as shown in FIG. 3A, n-AlAs layers and n-GaAs layers are epitaxially grown in alternating manner on the n-type GaAs substrate 30 to make 27 pairs thereof as a n-type AlAs/GaAs reflection layer 31 in which each layer has a thickness corresponding to a quarter of 1.55 $\mu$m optical length.

As shown in FIG. 3B, on the other hand, a p-type InGaAsP/InP reflection layer 33 is formed on a p-type InP substrate 35 by an epitaxial growing P-InGaAsP layers and P-InP layers to make 10 pairs thereof, in which each layer has a thickness corresponding to a quarter of 1.55 $\mu$m optical length. Then an InGaAsP (bulk) active layer 34 is epitaxially formed as one having a thickness corresponding to 1.55 $\mu$m optical length, followed by epitaxially forming an n-type InGaAsP/InP reflection layer 32 using n-InGaAsP layers and n-InP layers in alternating manner as 10.5 pairs thereof, in which each layer has a thickness corresponding to a quarter of 1.55 $\mu$m optical length.

A surface of the epitaxially layered structure on the GaAs substrate 30 is treated with a solution of HF, while a surface of the epitaxially layered structure on the InP substrate 35 is treated with solutions of $H_2SO_4:H_2O_2:H_2O$ (3:1:1) and HF, for removing naturally-oxidized films on their surfaces. As shown in FIG. 4A, the former surface is brought into intimate contact with the latter surface and loaded in a hydrogen atmosphere, followed by an annealing around 600° C. for 1 hour to form a wafer-fused structure. After that, the Ins substrate 35 is etched down by a solution of $HCl:H_3PO_4$ (3:1) so as to expose a surface of the InGaAsP layer of the p-type InGaAsP/InP reflection layer 33. The exposed p-InGaAsP layer is etched down by a solution of $H_2SO_4:H_2O_2:H_2O$ (3:1:1) to make the p-InP layer appear.

As shown in FIG. 3C, furthermore, an AlAs/GaAs reflection layer 36 is formed on a p-type GaAs substrate 37 by epitaxially growing C-doped AlAs and GaAs layers in alternating manner to make a stack in which each layer has a thickness corresponding to a quarter of 1.55 $\mu$m optical length. A surface of the epitaxially layered structure is subjected to the same treatment as described above, and then the top surface of thereof (i.e., p-GaAs layer) is brought into contact with the p-InP layer positioned at the top of the above wafer-fused structure. Then the resulting structure is subjected to an annealing in a hydrogen atmosphere at a temperature of 600° C. for 1 hour. After that, the p-type GaAs substrate 37 is removed by a solution of ammonia water and hydrogen peroxide water to expose a surface of the reflection layer 36.

Circular patterns of 5 $\mu$m in diameter are formed on the exposed surface of the reflection layer 36 by photolithography. Furthermore, the reflection layer 36 is subjected to a reactive ion beam etching (RIBE) using a $Cl_2$ based gas at a accelerating voltage of 400 V to etch down the InGaAs/InP layer 32 under the active layer, and then a surface thereof is washed by a solution of $HCl:H_2PO_4$ (3:1) as a selective etching solution for InGaAsP to expose a surface of the InP layer.

Finally, AuZnNi/Au electrodes 41 are deposited on the top of the device, while AuGeNi/Au electrodes 43 are deposited on the underside of the device. In addition, AR coat layers 42 are formed on the underside of the device to be used as an output portion.

In this embodiment, the AlAs/GaAs multi-layered films are used as the reflection layers but not limited to. It is possible to provide one of the reflection layers as a dielectric multi-layered film.

In the above embodiment, the bulk of InGaAsP was used as the active layer but not limited to. The same effects can be attained by providing a strained layer MQW active layer or non-strained MQW active layer made of InGaAsP/InGaAs.

2nd Embodiment

Figure 5B:
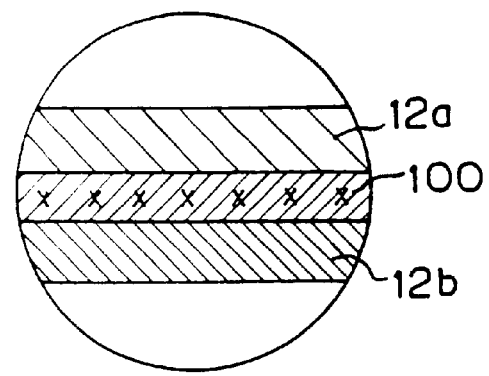
FIG. 5B is an enlargement of a portion of FIG. 5A.
Figure 5A:
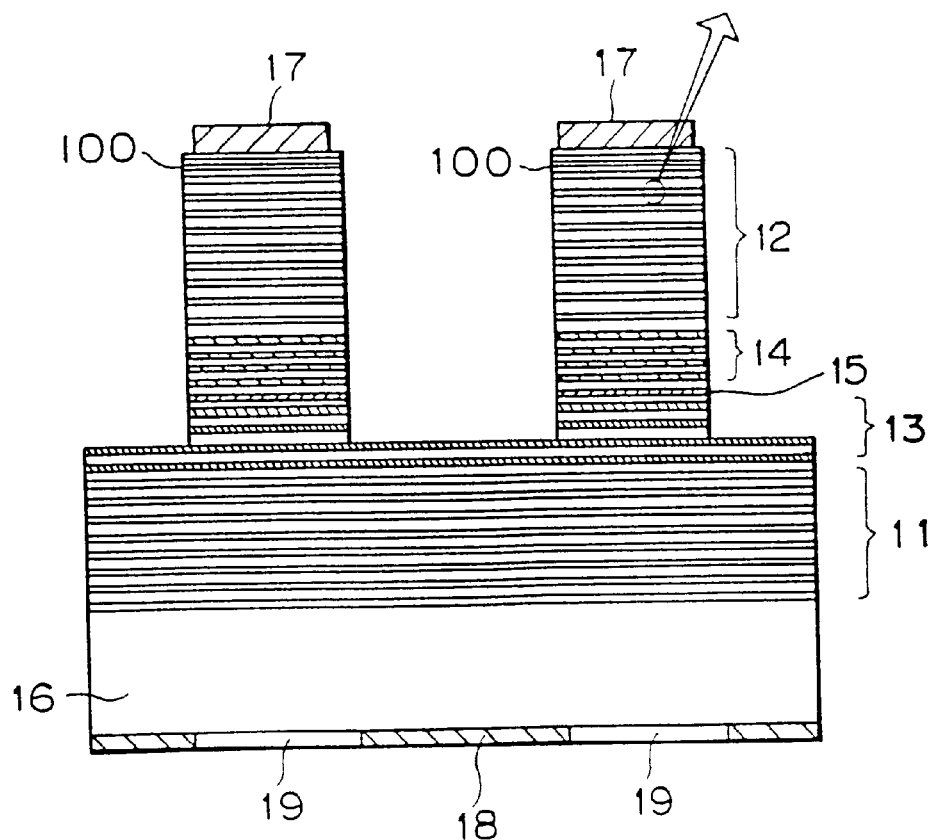
FIG. 5A is a schematic sectional view of a second preferred embodiment of the long-wavelength VCSELs in accordance with the present invention.

FIG. 5A is a schematic sectional view of a vertical-cavity surface-emitting laser (VCSEL) as a second preferred embodiment of the present invention. The laser of the present embodiment has the same construction as that of the first embodiment except the p-type fourth semiconductor layer (i.e., AlGaAs/AlGaAs reflection layer) 12 which comprises two different types of AlGaAs layers 12a, 12b having different compositions. In this embodiment, as shown in the figure, another type of AlGaAs layers 100 is further formed as a considerably thinner film provided between the above two different types of AlGaAs layers 12a, 12b. The AlGaAs layer 100 has a composition (hereinafter referred as a mid-composition) in which an amount of each constituent is almost in the middle of the range between that of the layers 12a, 12b.

One of the two types of the AlGaAs layers, which has a less Al content and a smaller band gap compared with that of the other type, is placed between the AlGaAs layers having larger band gaps. It is noted that the above AlaGAs layer 100 having the intermediate composition may be only formed between the smaller band group AlGaAs and the larger band gap AlGaAs placed on the active layer's side.

By the way, holes tend to concentrate on a valence band even if under the doped condition. Thus the AlGaAs layer 100 having the mid-composition assists for holes to move onto the AlGaAs having a larger band gap after passing over the band-discontinuity of the valence band.

In addition, the AlGaAs layer 100 is formed as an extremely thin film, as described above, so that it prevents the change in optical properties of the reflection layer to be caused by inserting a new layer. It means that a resistance of the p-type multiple layered structure to be provided as a reflection layer of the present invention, which tends to become higher even if the doping concentration is higher than usual, becomes lower than usual as a result of inserting the additional layer of AlGaAs formed as an extremely thin film made of the mid-composition. In this case, furthermore, the change in optical properties of the p-type multiple layered structure can be substantially disregarded.

Referring now to FIGS. 6A–6C and FIG. 7A and 7B, we are going to describe the process of fabricating the vertical-cavity surface-emitting laser having the above construction.

Figure 6A:
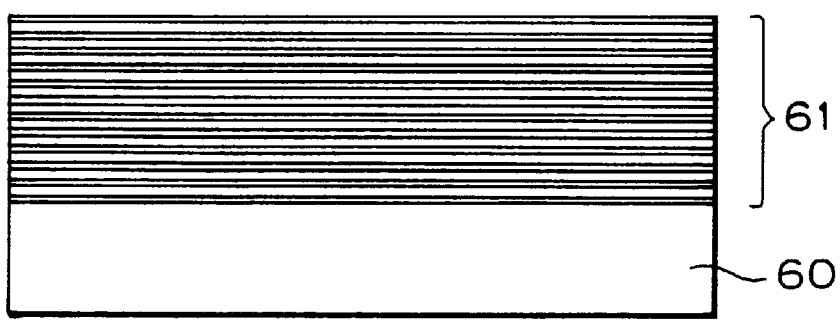
FIGS. 6A to 6C are schematic sectional views of epitaxial structures for explaining the steps of the process for manufacturing the second preferred embodiments of the long-wavelength VCSELs in accordance with the present invention.
Figure 6B:
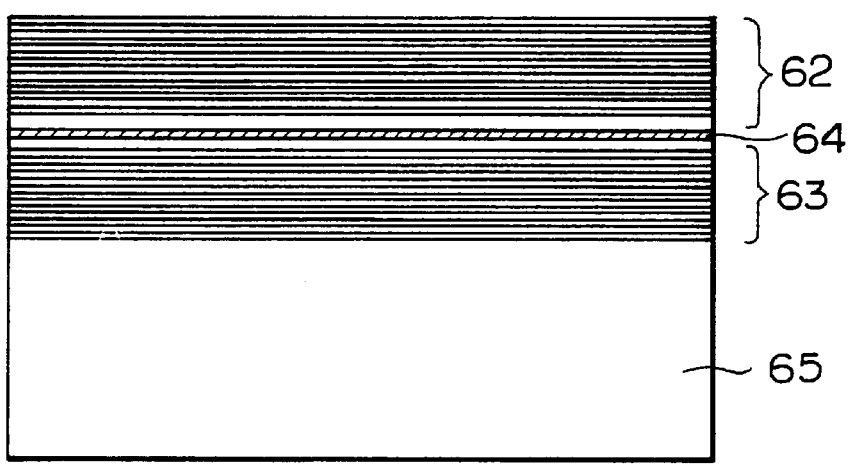
Figure 6C:
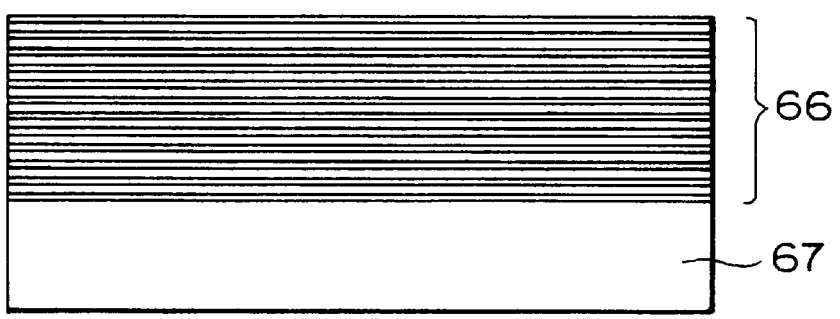
Figure 7A:
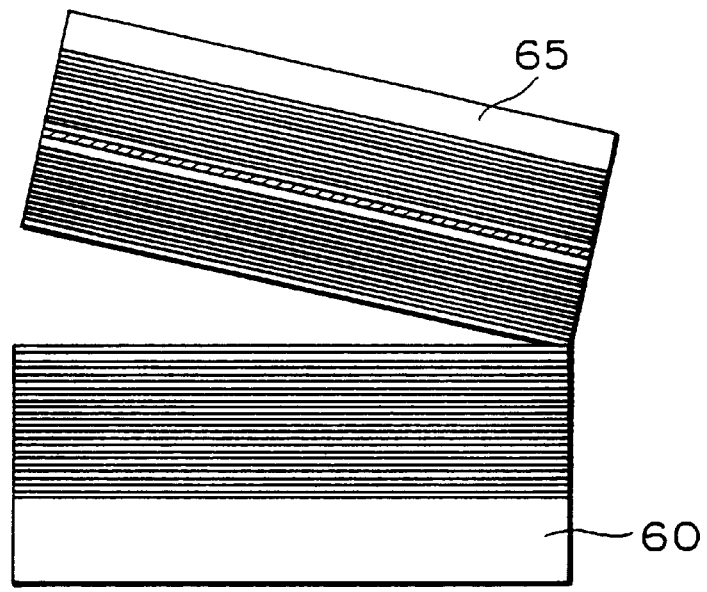
FIGS. 7A and 7B are schematic sectional views of wafer-fused structures among epitaxial structures of FIGS. 6A to 6C.
Figure 7B:
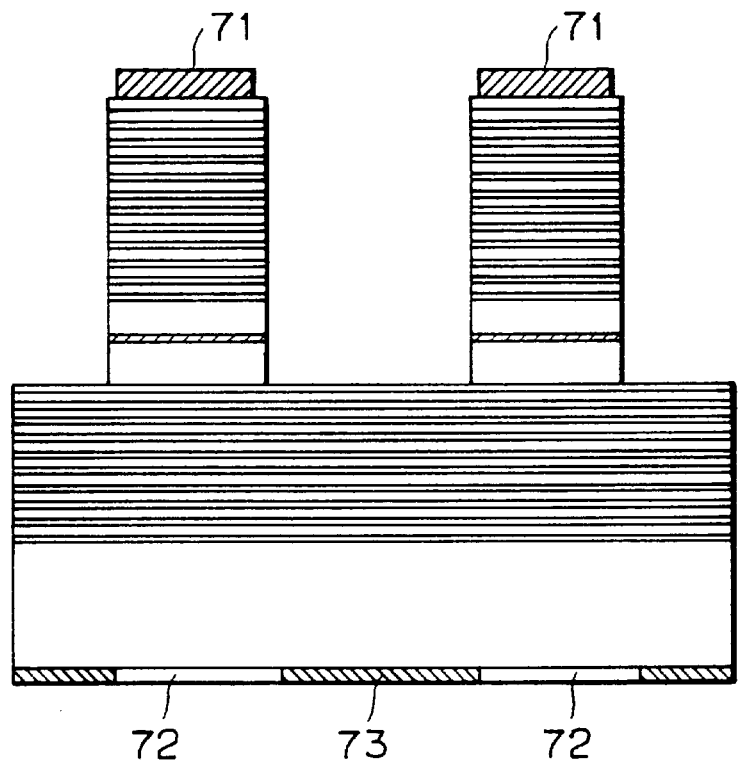

FIGS. 6A to 6C are cross-sectional views of three epitaxial structures and FIGS. 7A and 7B are cross-sectional views of wafer-fused structure for explaining the process for manufacturing the VCSEL of the present embodiment.

By the first step, as shown in FIG. 6A, n-AlAs layers and n-GaAs layers are epitaxially grown in alternating manner on the n-type GaAs substrate 60 to make 27 pairs thereof as a n-type AlAs/GaAs reflection layer 61, in which each of the layers has a thickness corresponding to a quarter of 1.55 $\mu$m optical length.

As shown in FIG. 6B, on the other hand, a p-type InGaAsP/InP reflection layer 63 is formed on a p-type InP substrate 65 by an epitaxial growth of 10 pairs of P-InGaAsP layer and P-InP layer, in which each of the layers has a thickness corresponding to a quarter of 1.55 $\mu$m optical length. Then an InGaAsP (bulk) active layer 64 is epitaxially formed as one having a thickness corresponding to 1.55 $\mu$m optical length, followed by epitaxially forming an n-type InGaAsP/InP reflection layer 62 using n-InGaAsP layers and n-InP layers in alternating manner as 10.5 pairs thereof, in which each layer has a thickness corresponding to a quarter of 1.55 $\mu$m optical length.

A surface of the epitaxially layered structure on the GaAs substrate 60 is treated with a solution of HF, while a surface of the epitaxially layered structure on the InP substrate 65 is treated with solutions of $H_2SO_4:H_2O_2:H_2O$ (3:1:1) and HF to remove naturally-oxidized films on their surfaces. As shown in FIG. 7A, the former surface is brought into intimate contact with the latter surface and loaded in a hydrogen atmosphere, followed by an annealing at 600° C. for 1 hour to form a wafer-fused structure. After that, the InP substrate 65 is etched down by a solution of $HCl:H_3PO_4$ (3:1) so as to expose a surface of the InGaAsP layer of the p-type InGaAsP/InP reflection layer. The exposed p-InGaAsP layer is etched down by a solution of $H_2SO_4:H_2O_2:H_2O$ (3:1:1) to make a surface of the p-InP layer appear. Then an AlAs/AlGaAs/GaAs reflection layer 66 is formed on a p-type GaAs substrate 67 by epitaxially growing C-doped AlAs, GaAs, and $Al_{0.5}Ga_{0.05}As$ layers in alternating manner on the GaAs substrate 67 to make a stack of 27 pairs thereof in which the AlAs and GaAs layers have the thickness of a quarter of 1.55 μm optical length, respectively, while the $Al_{0.5}Ga_{0.05}As$ layer has a thickness of 10 nm. A surface of the epitaxially layered structure is subjected to the same treatment as described above, and then the top surface of thereof (i.e., p-GaAs layer) is brought into contact with the p-InP layer positioned at the top of the above wafer-fused structure. Then the resulting structure is subjected to an annealing in a hydrogen atmosphere at a temperature of 600° C. for 1 hour. After that, the p-type GaAs substrate 67 is removed by a solution of ammonia water and hydrogen peroxide water to expose a surface of the reflection layer 66. Circular patterns of 5 μm in diameter are formed on the exposed surface of the reflection layer 66 by photolithography. Furthermore, the reflection layer 66 is subjected to a reactive ion beam etching (RIBE) using a $Cl_2$ based gas at an accelerating voltage of 400 V to etch into the InGaAs/InP layer 62 under the active layer, and then a surface thereof is washed by a solution of $HCl:H_2PO_4$ (3:1) as a selective etching solution for InGaAsP to expose a surface of the InP layer.

Finally, as shown in FIG. 7B, AuZnNi/Au electrodes 71 are deposited on the top of the device, while AuGeNi/Au electrodes 73 are deposited on the underside of the device. In addition, AR coat layers 72 are formed on the underside of the device to be used as an output portion.

In this embodiment, the AlAs/GaAs multi-layered films are used as the reflection layers but not limited to. It is possible to provide one of the reflection layers as a dielectric multi-layered film.

In the above embodiment, the bulk of InGaAsP was used as the active layer but not limited to. The same effects can be attained by providing a strained layer MQW active layer or a non-strained MQW active layer made of InGaAsP/InGaAs.

3rd Embodiment

Figures 8A, 8B:
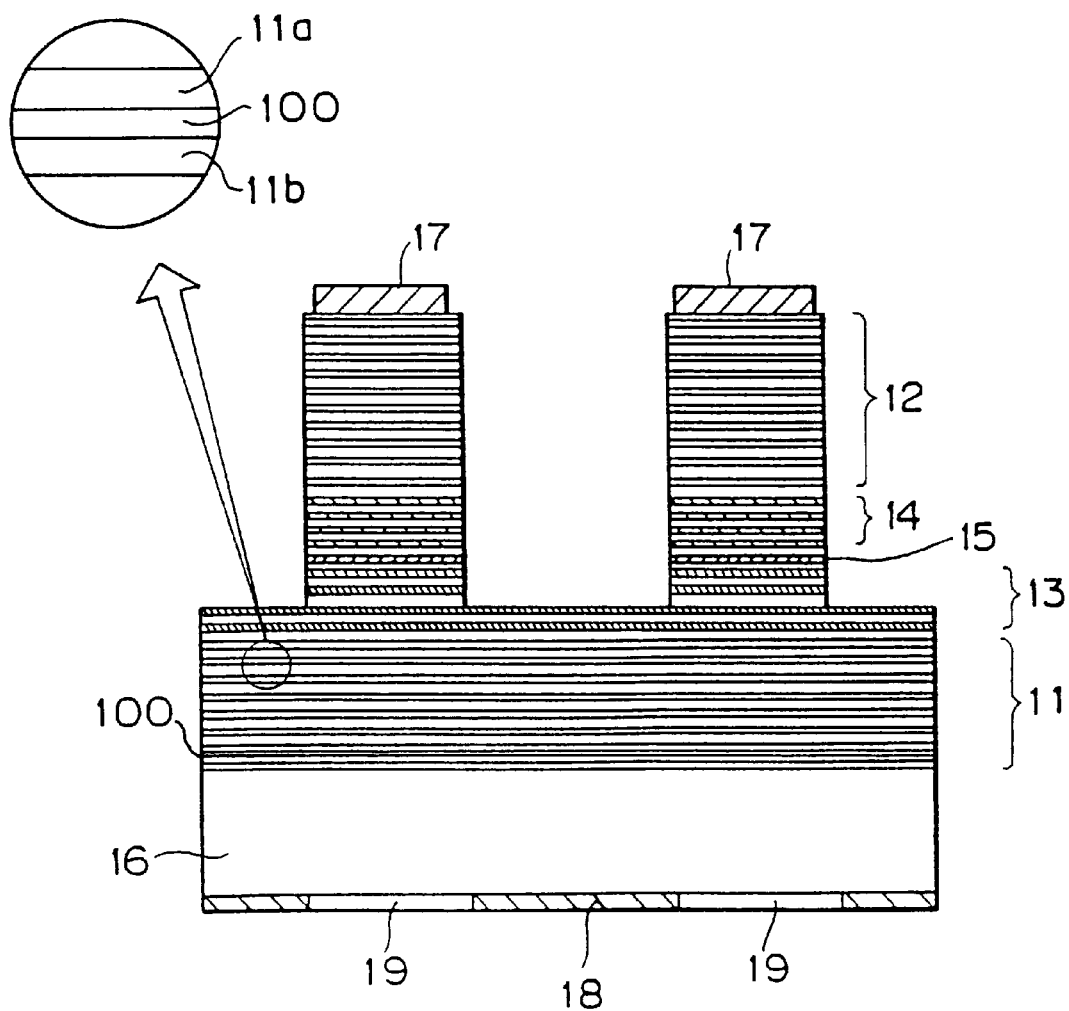
FIG. 8A is a schematic sectional view of a third preferred embodiment of the long-wavelength VCSELs in accordance with the present invention.
FIG. 8B is an enlargement of a portion of FIG. 8A.

FIG. 8A is a schematic sectional view of a vertical-cavity surface-emitting laser (VCSEL) as a third preferred embodiment of the present invention. The laser of the present embodiment has the same construction as that of the second embodiment except in the follows.

In this embodiment, a n-type first semiconductor (AlGaAs/AlGaAs reflection layer) 11 comprises two different types of AlGaAs layers 11a, 11b having different compositions. As shown in the figure, another type of AlGaAs layers 100 is further formed as a considerably thinner film provided between the above two different types of AlGaAs layers 11a, 11b. A resistance of the n-type multiple layered structure is easy to be decreased as compared with that of the p-type one. In this case, however, it can be further decreased by inserting the above the additional layer of AlGaAs formed as an extremely thin film made of the mid-composition.

Next, we are going to describe the process of fabricating the vertical-cavity surface-emitting laser having the above construction.

Referring now to FIGS. 9A–9C and FIG. 10A and 10B, we are going to describe the process of fabricating the vertical-cavity surface-emitting laser having the above construction.

Figure 9A:
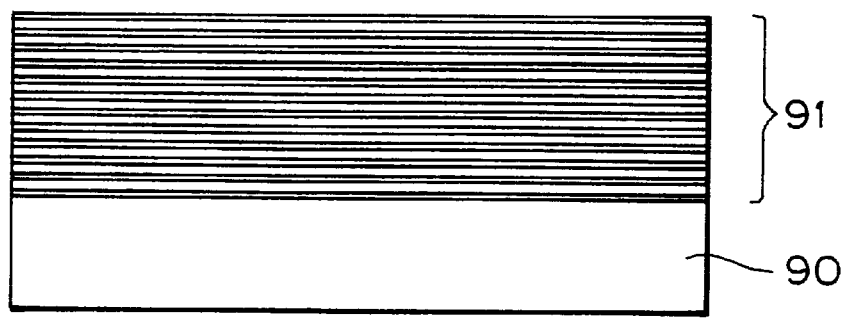
FIGS. 9A to 9C are schematic sectional views of epitaxial structures for explaining the steps of the process for manufacturing the third preferred embodiments of the long-wavelength VCSELs in accordance with the present invention.
Figure 9B:
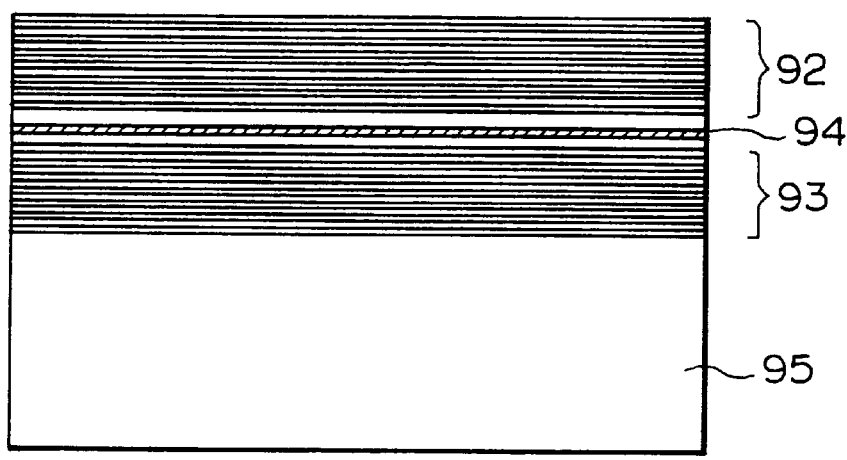
Figure 9C:
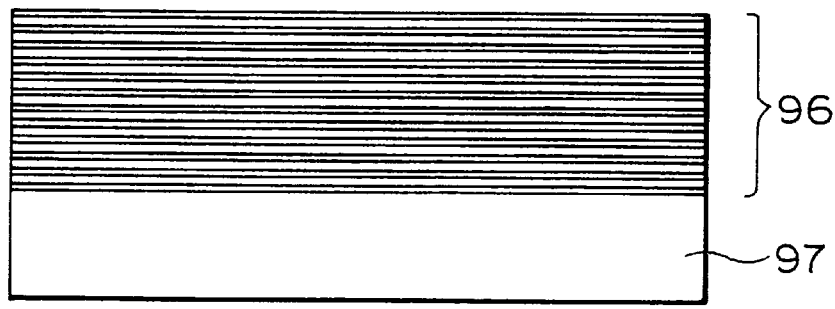
Figure 10A:
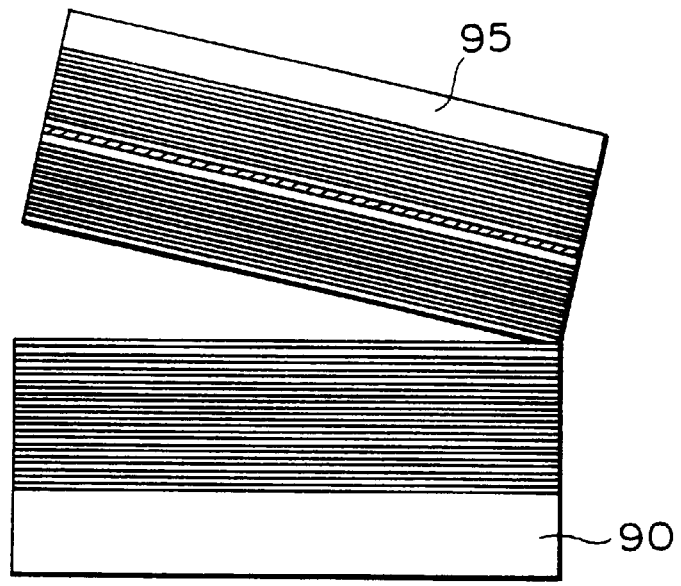
FIGS. 10A and 10B are schematic sectional views of wafer-fused structures among epitaxial structures of FIGS. 9A to 9C.
Figure 10B:
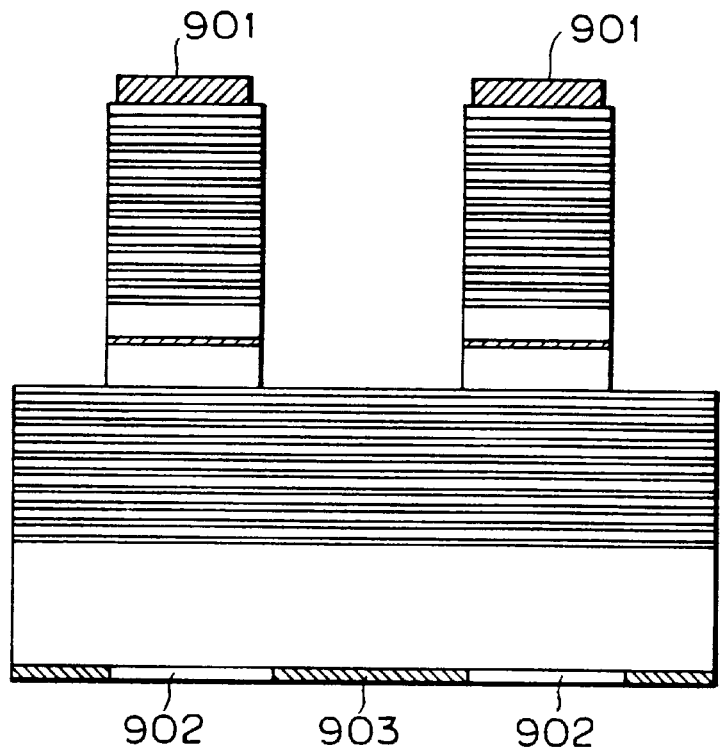

FIGS. 9A to 9C are cross-sectional views of three epitaxial structures and FIGS. 10A and 10B are cross-sectional views of wafer-fused structure for explaining the process for manufacturing the VCSEL of the present embodiment.

By the first step, as shown in FIG. 9A, an AlAs/AlGaAs/GaAs reflection layer 91 is formed on a n-type GaAs substrate 90 by epitaxially growing n-type AlAs, GaAs, and $Al_{0.5}Ga_{0.5}As$ layers in alternating manner on the GaAs substrate 90 to make a stack of 27 pairs thereof in which the AlAs and GaAs layers have the thickness corresponding to a quarter of 1.55 μm optical length, respectively, while the $Al_{0.5}Ga_{0.5}As$ layer has a thickness of 10 nm.

As shown in FIG. 9B, on the other hand, a p-type InGaAsP/InP reflection layer 93 is formed on a p-type InP substrate 95 by an epitaxial growth of 10 pairs of p-InGaAsP layer and p-InP layer, in which each of the layers has a thickness corresponding to a quarter of 1.55 μm optical length. Then an InGaAsP (bulk) active layer 94 is epitaxially formed as one having a thickness corresponding to 1.55 μm optical length, followed by epitaxially forming an n-type InGaAsP/InP reflection layer 92 using n-InGaAsP layers and n-InP layers in alternating manner as 10.5 pairs thereof, in which each of the layer has a thickness corresponding to a quarter of 1.55 μm optical length.

A surface of the epitaxially layered structure on the GaAs substrate 90 is treated with a solution of HF, while a surface of the epitaxially layered structure on the InP substrate 95 is treated with solutions of $H_2SO_4:H_2O_2:H_2O$ (3:1:1) and HF to remove naturally-oxidized films on their surfaces. As shown in FIG. 10A, the former surface is brought into intimate contact with the latter surface and loaded in a hydrogen atmosphere, followed by an annealing at 600° C. for 1 hour to form a wafer-fused structure. After that, the InP substrate 95 is etched down by a solution of $HCl:H_3PO_4$ (3:1) so as to expose a surface of the InGaAsP layer of the p-type InGaAsP/InP reflection layer 93. The exposed p-InGaAsP layer is etched down by a solution of $H_2SO_4:H_2O_2:H_2O$ (3:1:1) to make a surface of the p-InP layer appear. Then an AlAs/AlGaAs/GaAs reflection layer 96 is formed on a p-type GaAs substrate 97 by epitaxially growing C-doped AlAs, GaAs, and AlGaAs layers in alternating manner on the GaAs substrate 97 to make a stack of 27 pairs thereof, in which each of the layers has a thickness corresponding to a quarter of 1.55 μm optical length. A surface of the epitaxially layered structure is subjected to the same treatment as described above, and then the top surface of thereof (i.e., p-GaAs layer) is brought into contact with the p-InP layer positioned at the top of the above wafer-fused structure. Then the resulting structure is subjected to an annealing in a hydrogen atmosphere at a temperature of 600° C. for 1 hour. After that, the p-type GaAs substrate 97 is removed by a mixture solution of ammonia water and hydrogen peroxide water to expose a surface of the reflection layer 96.

Circular patterns of 5 μm in diameter are formed on the exposed surface of the reflection layer 96 by the step of photolithography. Furthermore, the reflection layer 96 is subjected to a reactive ion beam etching (RIBE) using a $Cl_2$ based gas at an accelerating voltage of 400 V to etch into the InGaAs/InP layer 92 under the active layer, and then a surface thereof is washed by a solution of $HCl:H_2PO_4$ (3:1) as a selective etching solution for InGaAsP to expose a surface of the InP layer.

Finally, AuZnNi/Au electrodes 901 are deposited on the top of the device, while AuGeNi/Au electrodes 903 are deposited on the underside of the device. In addition, AR coat layers 902 are formed on the underside of the device to be used as an output portion.

In this embodiment, the AlAs/GaAs multi-layered films are used as the reflection layers but not limited to. It is possible to provide one of the reflection layers as a dielectric multi-layered film.

In the above embodiment, the bulk of InGaAsP was used as the active layer but not limited to. The same effects can be attained by providing a strained layer MQW active layer or a non-strained MQW active layer made of InGaAsP/InGaAs.

4th Embodiment

Figure 11:
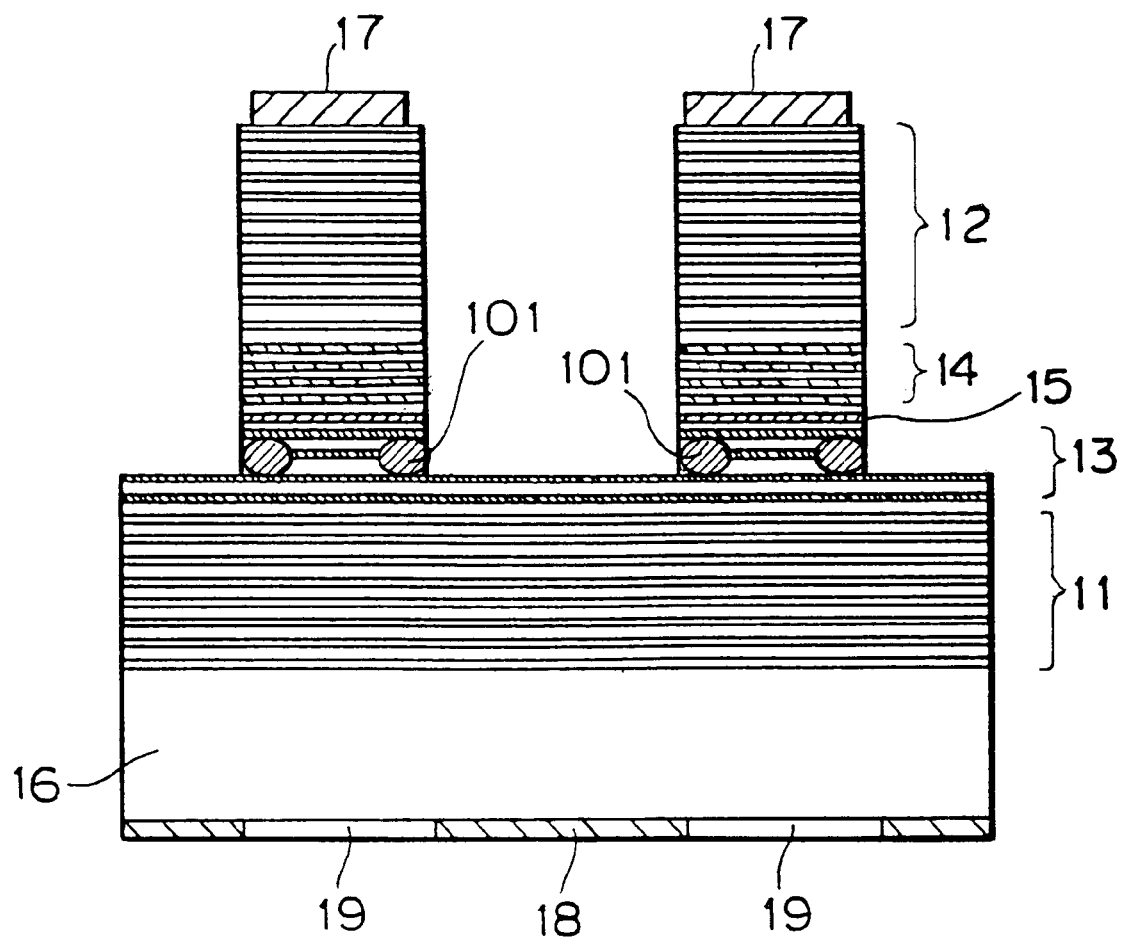
FIG. 11 is a schematic sectional view of a fourth preferred embodiment of the long-wavelength VCSELs in accordance with the present invention.

FIG. 11 is a schematic sectional view of a vertical-cavity surface-emitting laser (VCSEL) as a fourth preferred embodiment of the present invention. The laser of the present embodiment has the same construction as that of the second embodiment except that an insulation layer 101 is formed by performing an ion-injection on the InGaAP/InGaAsP reflection layer 14. Therefore the active layer receives a high current injection as a current crowding effect, so that a less threshold current can be observed. In this laser structure, only a thin emitting region may be subjected to the ion-injection, so that it is possible to use a stable ion species such as oxygen in spite of only introducing into a near-surface region. When the ion species is selected from light ions such as hydrogen, in general, ions are introduced deeply through the whole reflection layer and laterally distributed to damage the active layer. In this embodiment, however, there is no possibility of causing such a damage.

Next, we are going to describe the process of fabricating the vertical-cavity surface-emitting laser having the above construction.

FIGS. 12A–12C and 13A–13B are cross-sectional views of the structures for explaining each step of the process for manufacturing a log-wavelength VCSEL of the present embodiment.

Figure 12A:
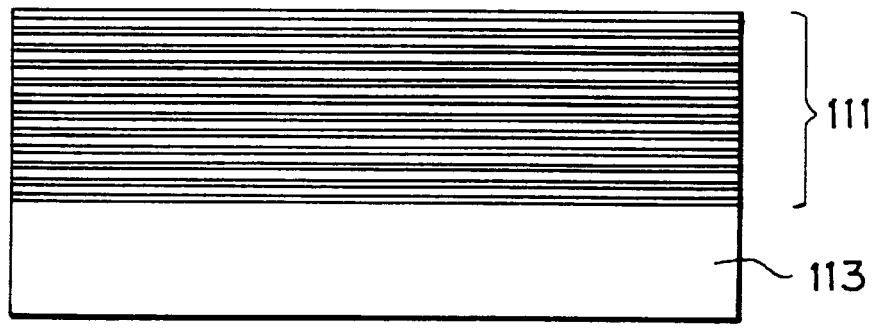
FIGS. 12A to 12C are schematic sectional views of epitaxial structures for explaining the steps of the process for manufacturing the fourth preferred embodiments of the long-wavelength VCSELs in accordance with the present invention.

As shown in FIG. 12A, a first reflection layer 111 is formed on a n-type GaAs substrate 113 by epitaxially growing n-GaAs and AlAs layers with a dopant of $3 \times 10^{18}$ cm$^{-3}$ in alternating manner to make a stack of 25 pairs thereof on the GaAs substrate 113, in which each of layer has a thickness corresponding to a quarter of 1.55 μm optical length.

Figure 12B:
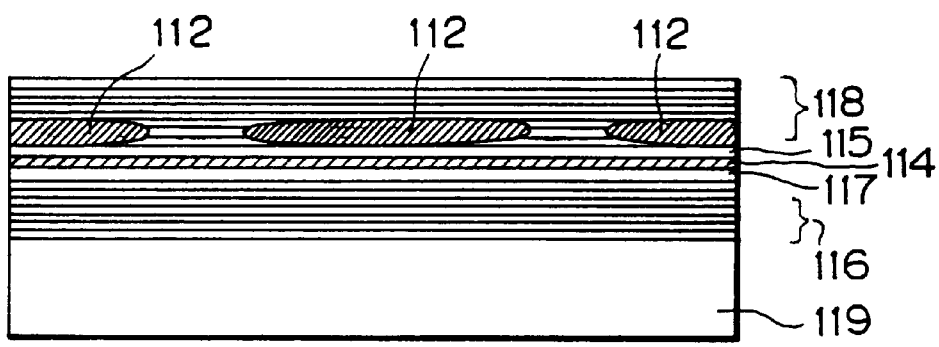
Figure 12C:
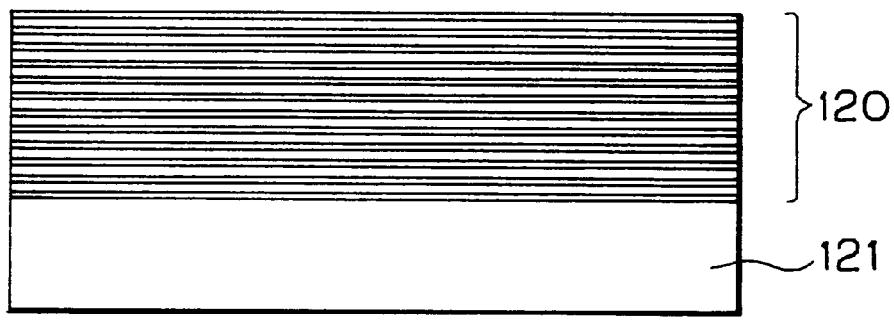

In addition, as shown in FIG. 12C, a fourth reflection layer 120 is formed on a p-GaAs substrate 121 by epitaxially growing p-GaAs, AlGaAs, and AlAs layers in alternating manner to make a stack of 30 pairs thereof on the p-GaAs substrate 121, in which each of layer has a thickness of a quarter of 1.55 μm optical length.

As shown in FIG. 12B, on the other hand, P-InGaAsP layer and P-InP layers are epitaxially grown in alternating manner on a p-type InP substrate 119 to make 5 pairs thereof as a p-type InGaAsP/InP reflection layer 116 with a thickness corresponding to a quarter of 1.55 μm optical length. Then an InGaAsP (bulk) active layer 114 is epitaxially formed as one having a thickness corresponding to 1.55 μm optical length, followed by epitaxially forming an n-type InGaAsP/InP reflection layer 118 using n-InGaAsP layers and n-InP layers in alternating manner as 5.5 pairs thereof, in which each of the layers has a thickness corresponding to a quarter of 1.55 μm optical length.

Circular photoresist patterns of 10 μm in diameter are formed on the top of the epitaxially grown layers on the InP substrate 119, and then oxygen ions of $2 \times 10^{14}$ cm$^{-3}$ are introduced therein at an acceleration voltage of 80 keV to make insulation regions 112. After removing the photoresist, the resulting structure is subjected to an annealing in a hydrogen atmosphere at temperature of 450° C.

Figure 13A:
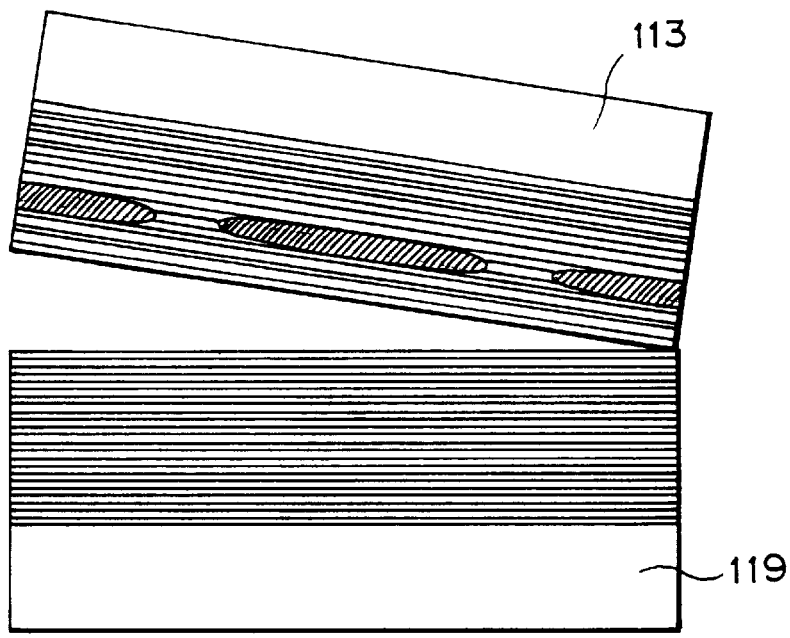
FIGS. 13A and 13B are schematic sectional views of wafer-fused structures among epitaxial structures of FIGS. 12A to 12C.

Naturally-oxidized films on the first reflection layer 111 and the n-type InGaAsP/InP reflection layer 118 are removed by treating with a solution of HF, then the former surface is brought into intimate contact with the latter surface and loaded in a hydrogen atmosphere, followed by an annealing at 600° C. to form a wafer-fused structure as shown in FIG. 13A. Using HCl and $H_3PO_4$, the InP substrate 119 is removed by means of etching.

Furthermore, a naturally-oxidized film of the fourth reflection layer 120 on the p-GaAs substrate 121 is removed by a solution of HF. Then a surface of the reflection layer 120 is brought into intimate contact with a surface of the p-InGaAsP/p-InP reflection layer 116 and loaded in a hydrogen atmosphere, followed by an annealing at 600° C. to form a wafer-fused structure.

After that, the resulting wafer-fused structure is subjected to a mixture solution of ammonia water and hydrogen peroxide water to remove the p-type GaAs substrate 121 and to expose a surface of the AlAs layer. Then the exposed AlAs layer is further etched by a HF solution.

The resulting structure is subjected to a reactive ion beam etching (RIBE) for the purpose of electrically dividing elements.

Figure 13B:
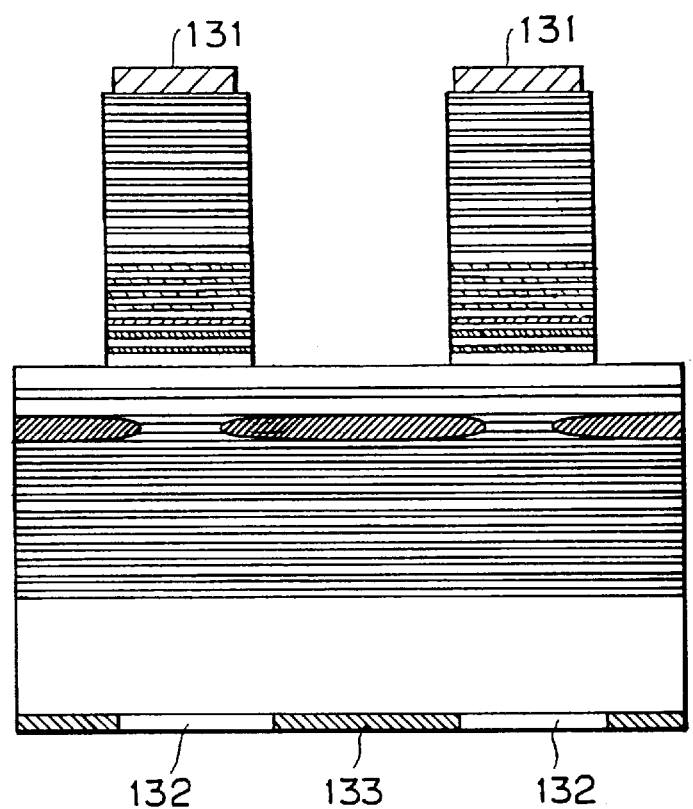

Finally, as shown in FIG. 13B, a p-type AuZnNi/Au electrodes 131 are deposited on the top of the device, while AuGeNi/Au electrodes 133 are deposited on the underside of the device. In addition, AR coat layers 132 are formed on the underside of the device to be used as an output portion.

The light-current characteristics of the long-wavelength VCSEL obtained by the above process revealed that the laser was oscillated at the threshold current of 4 mA with an oscillation wavelength of 1.55 μm. In this case, furthermore, there was no current crowded region in the p-type reflection layer with high resistance, so that the device resistance takes a small value as 20 Ω at a current in approximity to the threshold.

In this embodiment, the semiconductor multi-layered films are used as the reflection layers but not limited to. It is also possible to provide one of the reflection layers as a dielectric multi-layered film. In this case, the electrode on the side of the dielectric multi-layered film may be formed as in the same way as that of the conventional VCSEL that uses the dielectric multi-layered film.

In this embodiment, oxygen ions are introduced for preparing the current crowded region. In this case, however, it is possible to use other ions to get the same effects as that of the oxygen-injection.

In the above embodiment, furthermore, the bulk of InGaAsP was used as the active layer but not limited to. The same effects can be attained by providing a strained layer MQW active layer or a non-strained MQW active layer made of InGaAsP/InGaAs.

5th Embodiment

Figure 14:
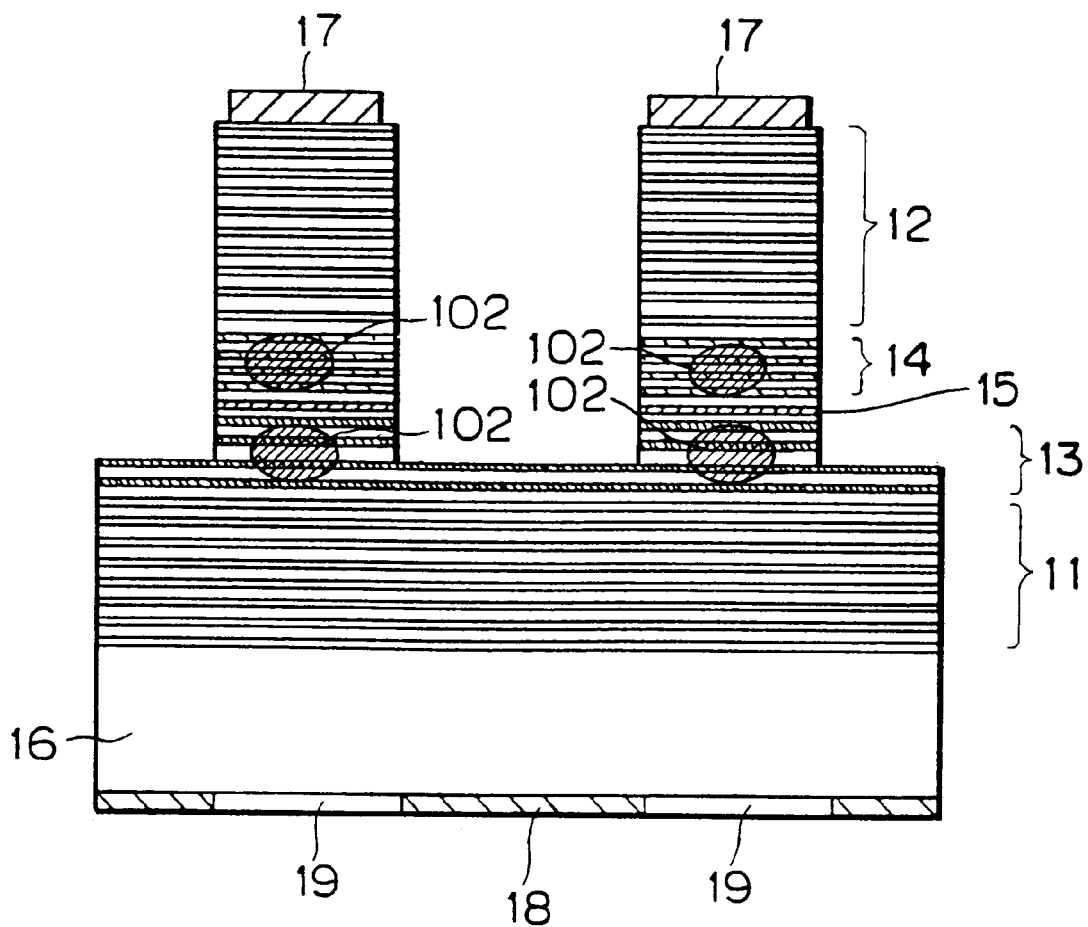
FIG. 14 is a schematic sectional view of a fifth preferred embodiment of the long-wavelength VCSELs in accordance with the present invention.

FIG. 14 is a schematic sectional view of a vertical-cavity surface-emitting laser as a fifth preferred embodiment of the present invention. The laser of the present embodiment has the same construction as that of the second embodiment except that non-doping layers are formed between the active layer 15 and InGaAP/InGaAsP reflection layers 13, 14, respectively, followed by introducing impurities into each of them to form conductive layers 102.

Consequently, the active layer receives a current with a current crowding effect, so that a lower threshold current can be observed.

Next, we are going to describe the process of fabricating the vertical-cavity surface-emitting laser having the above construction.

FIGS. 15A–15C and FIGS. 16A–16C are cross-sectional views of the structures for explaining each step of the process for manufacturing a log-wavelength VCSEL of the present embodiment.

Figure 15A:
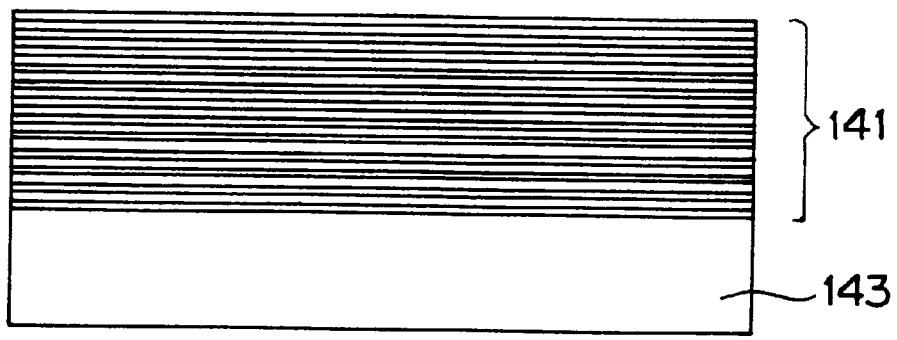
FIGS. 15A to 15C are schematic sectional views of epitaxial structures for explaining the steps of the process for manufacturing the fifth preferred embodiments of the long-wavelength VCSELs in accordance with the present invention.

As shown in FIG. 15A, a first reflection layer 141 is formed on a n-type GaAs substrate 143 by epitaxially growing n-GaAs and AlAs layers in alternating manner to make a stack of 25 pairs thereof on the GaAs substrate 143, in which each of layer has a thickness corresponding to a quarter of 1.55 μm optical length.

In addition, as shown in FIG. 14C, a second reflection layer 142 is formed on a p-GaAs substrate 1410 by epitaxially growing p-GaAs, AlGaAs, and AlAs layers in alternating manner to make a stack of 30 pairs thereof on the p-GaAs substrate 1410, in which each of layer has a thickness corresponding to a quarter of 1.55 μm optical length.

Figure 15B:
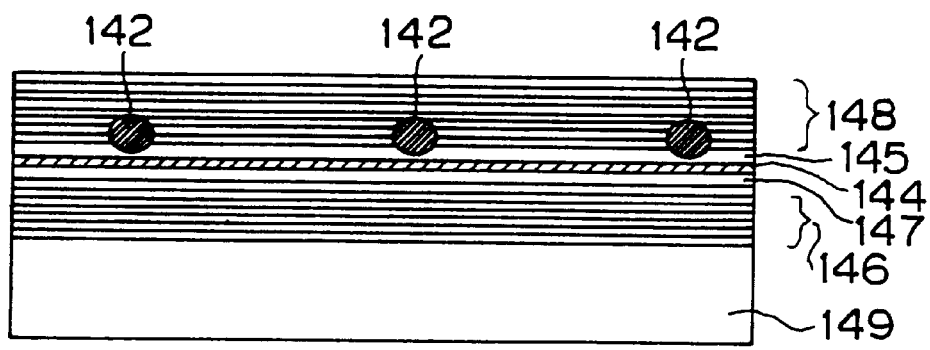
Figure 15C:
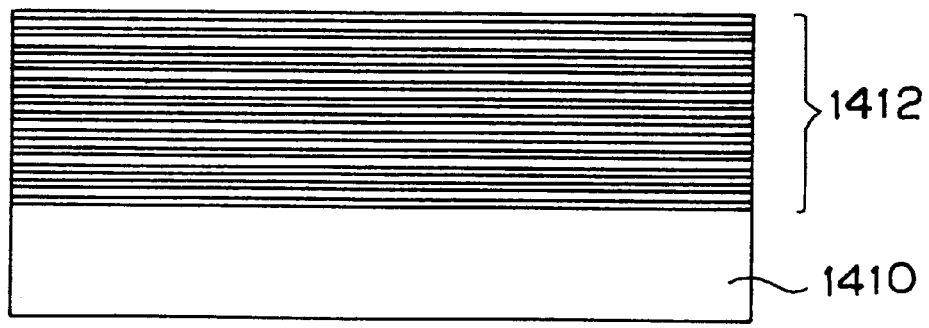

As shown in FIG. 15B, on the other hand, p-InGaAsP layer and p-InP layers are epitaxially grown in alternating manner on a p-type InP substrate 149 to make 5 pairs thereof as a p-type InGaAsP/InP reflection layer 146, in which each of the layer has a thickness corresponding to a quarter of optical length. Then a non-doped InP cladding layer 147 is formed on the reflection layer 146.

A multiple quantum well (MQW) active layer 144 is formed by piling up InGaAsP (1.3 μm composition) layers and InGaAs layers in alternating manner to make a 5.5 pairs thereof on the InP cladding layer 147. Then a non-doped InP cladding layer 145 is formed on the MQW active layer 144, and also n-InGaAs layers and n-InP layers are epitaxially grown in alternating manner on the non-doped cladding layer 145 to make 5.5 pairs thereof as an n-type InGaAs/InP reflection layers 148, in which each of the layer has a thickness corresponding to a quarter of the optical length.

Circular photoresist patterns of 10 μm in diameter are formed on the top of the epitaxially grown layers on the InP substrate 149, and then Si ions are introduced therein at an acceleration voltage of 100 keV to make doped regions 142 with the dose of $2 \times 10^{16}$ cm$^{-3}$. After removing the photoresist, the resulting structure is subjected to an annealing in a hydrogen atmosphere at a temperature of 450° C.

Figure 16A:
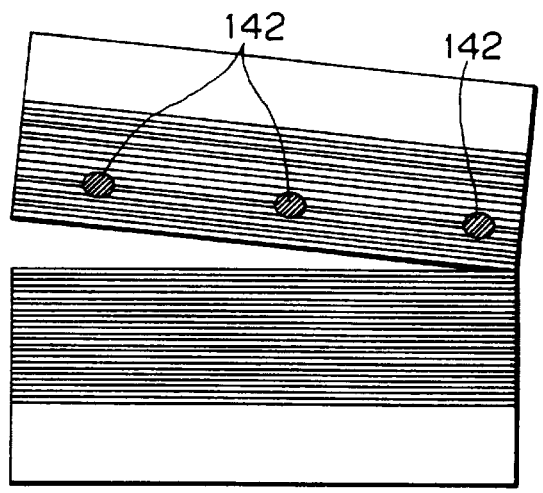
FIGS. 16A to 16C are schematic sectional views of wafer-fused structures among epitaxial structures of FIGS. 15A to 15C.
Figure 16B:
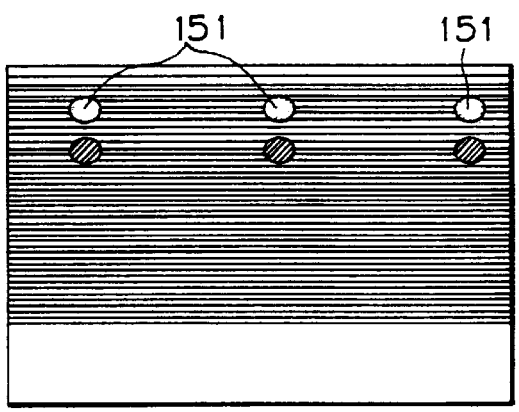

Naturally-oxidized films on the epitaxially grown layers on the n-GaAs and p-InP substrates 143, 149 are removed by treating with a solution of HF, then the former surface is brought into intimate contact with the latter surface and loaded in a hydrogen atmosphere, followed by an annealing at 600° C. to form a wafer-fused structure as shown in FIG. 16A. Using HCl and $H_3PO_4$, the InP substrate 149 is removed by means of etching.

Circular photoresist patterns of 10 μm in diameter are formed on the resulting structure, and then Be ions are introduced therein at an acceleration voltage of 100 keV to make doped regions 151 with the dose of $2 \times 10^{16}$ cm$^{-3}$. After removing the photoresist, the resulting structure is subjected to an annealing in a hydrogen atmosphere at temperature of 450° C.

Naturally-oxidized films on the epitaxially grown layers on the p-GaAs substrate 1410 are removed by treating with a solution of HF, then it is brought into intimate contact with the p-InGaAsP/p-InP reflection layer and loaded in a hydrogen atmosphere, followed by an annealing at 600° C. for 1 hour. Using a mixture solution of ammonia water and hydrogen peroxide, the p-GaAs substrate 1410 is removed by means of etching. Then the AlAs layer, a part of the reflection layer, is etched down by an aqueous solution of HF.

Figure 16C:
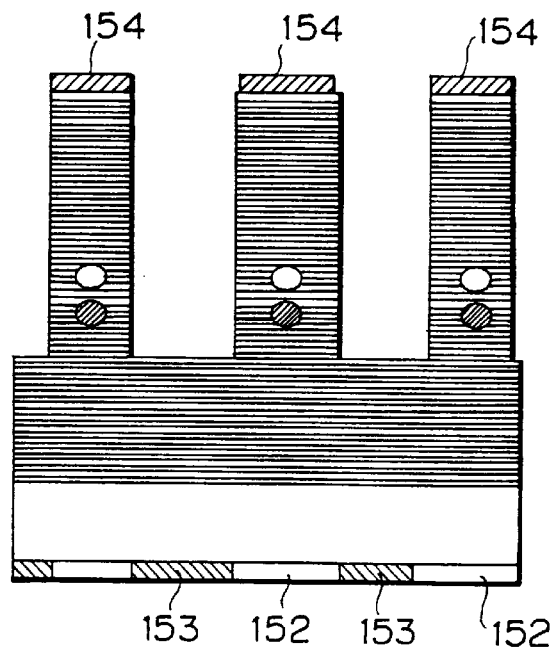

As shown in FIG. 16C, p-type AuZnNi/Au electrodes 154 are deposited on the top of the device, while AuGeNi/Au electrodes 153 are deposited on the underside of the device. In addition, AR coat layers 152 are formed on the underside of the device to be used as an output portion.

For electrically separating the elements, the distributed Bragg reflectors (DBR) layer is subjected to a reactive ion beam etching (RIBE) as shown in FIG. 16C.

The light-current characteristics of the long-wavelength VCSEL obtained by the above process revealed that the laser was oscillated at the threshold current of 6 mA.

In this embodiment, the semiconductor multi-layered films are used as the reflection layers but not limited to. It is possible to provide one of the reflection layers as a dielectric multi-layered film. In this case, the electrode on the side of the dielectric multi-layered film may be formed as in the same way as that of the conventional VCSEL that uses the dielectric one.

In this embodiment, a dopant is introduced into the cladding layer. However, it is also possible to attain similar effects by making a part of the mirror as a non-doped region and introducing ions therein.

In the above embodiment, furthermore, the bulk of InGaAsP was used as the active layer but not limited to. The same effects can be attained by providing a strained layer MQW active layer or a non-strained MQW active layer made of InGaAsP/InGaAs.

6th Embodiment

Figure 17:
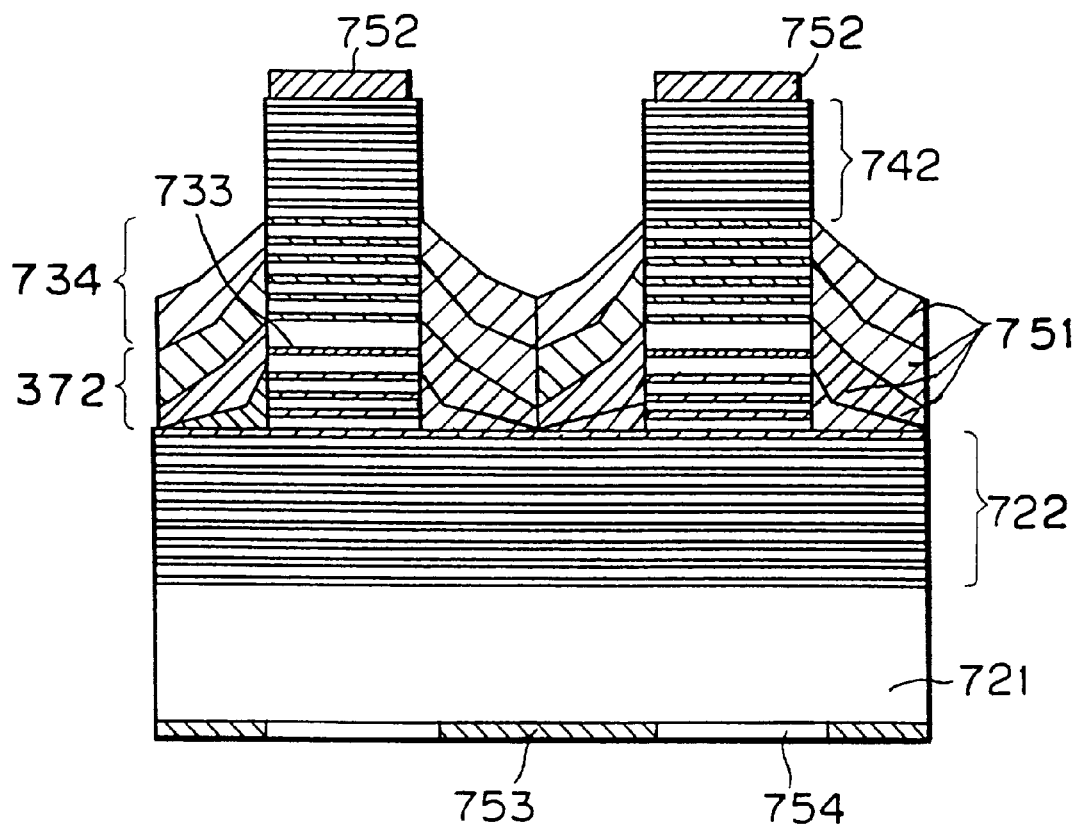
FIG. 17 is a schematic sectional view of a sixth preferred embodiment of the long-wavelength VCSELs in accordance with the present invention.

FIG. 17 is a schematic sectional view of a vertical-cavity surface-emitting laser (VCSEL) as a sixth preferred embodiment of the present invention. The laser of the present embodiment has a buried hetero-structure as shown in the figure.

A VCSEL consists of a plurality of stacked layers on an n-type GaAs substrate 721. As shown in the figure, AuGeNi/Au electrodes 753 and anti-reflection films 754 are provided on one surface (i.e., a bottom surface) of the GaAs substrate 721, while on the other surface thereof (i.e., an upper surface) there are stacked an n-type AlAs/GaAs reflection layer 722, an n-type InGaAsP/InP reflection layer 732, an InGaAsP active layer 733, a p-type InGaAsP/InP reflection layer 734, and a p-type AlAs/Al$_{0.5}$Ga$_{0.5}$As/GaAs reflection layer 742 in that order. A mesa structure is formed by etching down from an upper surface of the top layer (i.e., the p-type AlAs/Al$_{0.5}$Ga$_{0.5}$As/GaAs reflection layer 742) to a certain point of the n-type InGaAsP/InP reflection layer 722. Furthermore, a buried layer of n-InP/p-InP/n-InP/p-InP 751 is formed on the mesa structure. In addition, an AuZnNi/Au electrodes 752 is provided on the upper surface of the p-type AlAs/Al$_{0.5}$Ga$_{0.5}$As/GaAs reflection layer 742.

Next, we are going to describe the process of fabricating the vertical-cavity surface-emitting laser having the above construction.

FIGS. 18A to 18D are cross-sectional views of the structures for explaining each step of the process for manufacturing the VCSEL having the above buried hetero-structure.

Figure 18A:
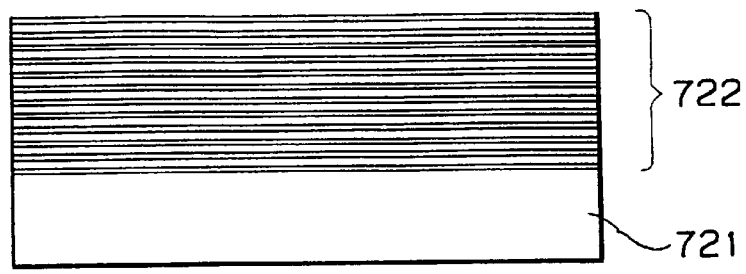
FIGS. 18A to 18D are schematic sectional views of epitaxial structures for explaining the steps of the process for manufacturing the sixth preferred embodiments of the long-wavelength VCSELs in accordance with the present invention.

By the first step, as shown in FIG. 18A, an AlAs/GaAs reflection layer 722 is formed on a n-type GaAs substrate 721. That is, AlAs layers and GaAs layers are epitaxially grown in alternating manner on the n-type GaAs substrate 721 to make 27 pairs thereof as the n-type AlAs/GaAs reflection layer 722, in which each of the layers has a thickness corresponding to a value obtained by dividing the emission wavelength (1.55 μm) by a refractive index and 4

(i.e., a thickness corresponding to a quarter of optical length for the emission wavelength).

Figure 18B:
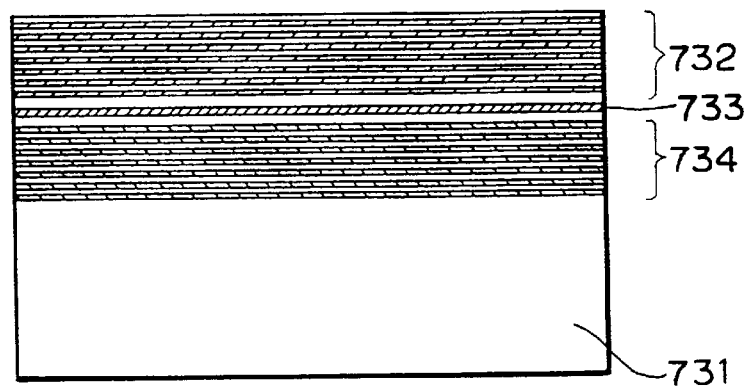

As shown in FIG. 18B, on the other hand, a p-type InGaAsP/InP reflection layer 734 is formed on a p-type InP substrate 731 by an epitaxial growth of 10.5 pairs of p-InGaAsP layer and p-InP layer in that order, in which each of the layers has a thickness corresponding to a quarter of 1.55 μm optical length. Then an InGaAsP (bulk) active layer 733 is epitaxially formed as one having a thickness corresponding to 1.55 μm optical length, followed by epitaxially forming an n-type InGaAsP/InP reflection layer 732 using n-InGaAsP layers and n-InP layers in alternating manner as 10 pairs thereof, in which each of the layers has a thickness corresponding to a quarter of 1.55 μm optical length.

Figure 18C:
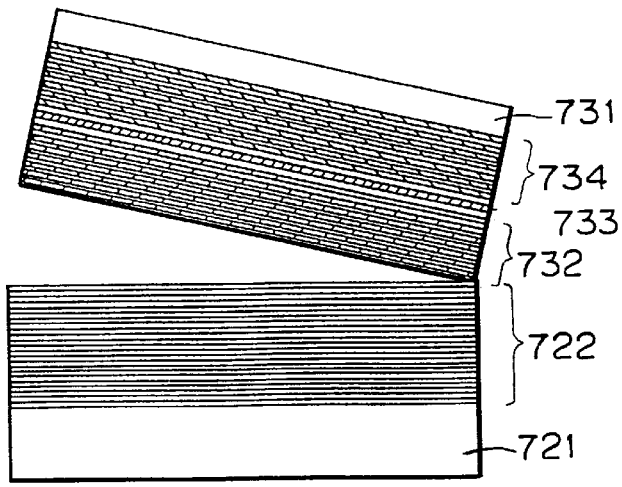

A surface of the epitaxial layer 722 on the GaAs substrate 721 is treated with HF, while a surface of the epitaxial layer 732 is treated with solutions of $H_2SO_4:H_2O_2:H_2O$ (3:1:1) and HF to remove naturally-oxidized films on their surfaces, and then, as shown in FIG. 18C, the former surface is brought into intimate contact with the latter surface and loaded in a hydrogen atmosphere, followed by an annealing at 600° C. for 1 hour. After that, the InP substrate 731 is etched by a solution of $HCl:H_3PO_4$ (3:1) so as to expose a surface of the p-type InGaAsP layer of the p-type InGaAsP/InP reflection layer 734. The exposed p-type InGaAsP layer is etched by a solution of $H_2SO_4:H_2O_2:H_2O$ (3:1:1) to make a surface of the p-InP layer appear.

Figure 18D:
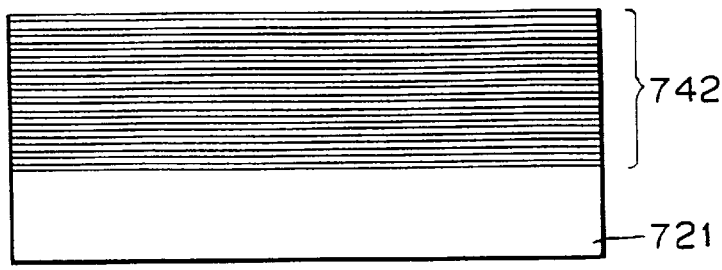

As shown in FIG. 18D, furthermore, a p-type AlAs/$Al_{0.5}Ga_{0.5}As$/GaAs reflection layer 742 is formed by the steps of: epitaxially growing p-type AlAs layers, p-$Al_{0.5}Ga_{0.5}As$ layers, and P-GaAs layers one after the other by turns, in which each of the p-type AlAs and P-GaAs layers is formed as one having a thickness corresponding to a quarter of 1.55 μm optical length, while each of the p-$Al_{0.5}Ga_{0.5}As$ layers is formed as a comparatively very thin film.

A surface of the obtained reflection layer 742 is subjected to the same treatment as described above. Then the p-GaAs layer positioned at the top of the epitaxial layer 742 on the p-type GaAs substrate 741 is brought into contact with the p-InP layer positioned at the top of the epitaxial layer 734 and loaded in a hydrogen atmosphere, followed by an annealing at 600° C. for 1 hour.

The p-type GaAs substrate 741 is removed from the epitaxial layer 742 by treating with a mixture solution of a ammonia water and hydrogen peroxide, and then circular patterns of 5 μm in diameter are formed by the step of photolithography. Furthermore, the n-InGaAsP/InP reflection layer is subjected to a reactive ion beam etching (RIBE) using a $Cl_2$ based gas at an accelerating voltage of 400 V to etch into the n-InGaAsP/InP reflection layer under the active layer 733, and then a surface thereof is washed by a solution of $HCl:H_3PO_4$ (3:1) as a selective etching solution for n-InGaAsP, resulting in a mesa structure.

Then an n-InP/p-InP/n-InP/p-InP buried layer 751 is formed on the mesa structure by growing thin layers of a n-InP, a p-InP, a n-InP, and a p-InP layer in that order, using a technique of metal organic chemical vapor deposition (MOCVD). Finally, AuZnNi/Au electrodes 752 are formed on the top of the device, while AuGeNi/Au electrodes 753 are formed on the underside of the device by evaporation, and then a AR coat layers 754 are formed on the underside thereof to be used as an output portion.

The light-current characteristics of the VCSEL obtained by the above process revealed that the laser was oscillated at the threshold current of 0.9 mA. In this case, furthermore, up to 10 mA, the device showed a single transverse mode.

In the above embodiment, the bulk of InGaAsP was used as the active layer but not limited to. The same effects can be attained by providing a strained layer MQW active layer or a non-strained MQW active layer made of InGaAsP/InGaAs.

For the fourth semiconductor multi-layer construction, in the above embodiment there was used the p-type AlAs/$Al_{0.5}Ga_{0.5}As$/GaAs reflection layer that basically comprises AlAs and GaAs which are piled repeatedly. However, the multi-layer construction may be prepared by stacking three different type of layers by turns. In the above embodiment, furthermore, each of the reflection layers is provided as a multi-layered film. However, one of these reflection layers may be a dielectric multi-layered film ($SiO_2/TiO_2$, $Si/AlO_3$, $Si/SiO_2$, or the like).

7th Embodiment

Figure 19:
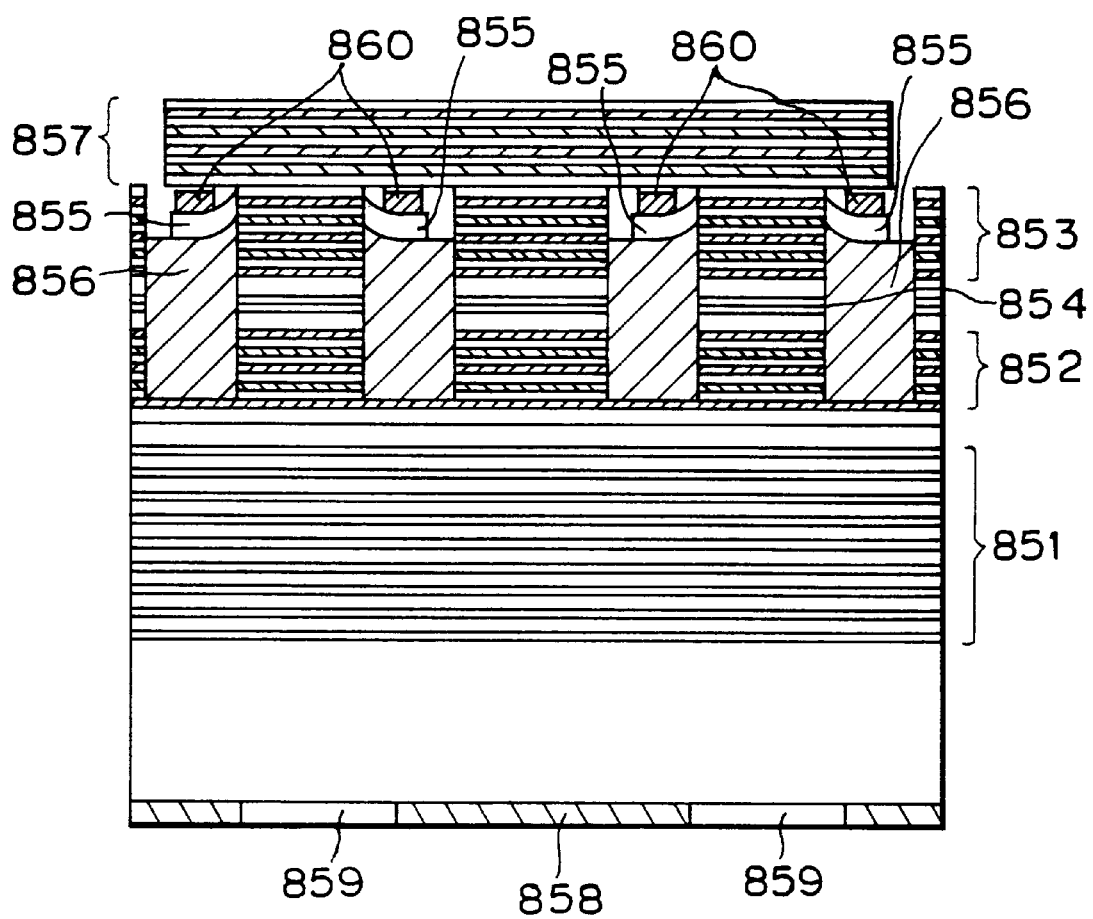
FIG. 19 is a schematic sectional view of a seventh preferred embodiment of the long-wavelength VCSELs in accordance with the present invention.

FIG. 19 is a schematic cross sectional view of the seventh embodiment of the vertical-cavity surface-emitting laser (VCSEL) in accordance with the present invention. As shown in the figure, the device comprises a p-GaAs/AlAs reflector 851, a p-InP/InGaAsP reflector 852, a n-InP/InGaAsP reflector 853, an active layer 854, a n-InP buried layer 855, a Fe-doped InP buried layer 856, a reflector as a $SiO2/TiO2$ dielectric multi-layered film 857, a p-type electrode 858, an anti-reflection (AR) coat film 859, and a n-type electrode 860.

The VCSEL is manufactured by the process including the steps of: epitaxially growing the layers of AlAs and GaAs by turns to form 25 pairs thereof on a p-type GaAs substrate, in which each layer has a thickness corresponding to a quarter of a predetermined optical length to form the p-GaAs/AlAs reflection layer 851; epitaxially growing the layers of n-InGaAsP and n-InP by turns to form 10.5 pairs thereof on a InP substrate to form the n-InP/InGaAsP reflector 853; forming an InGaAsP bulk active layer 854 with a thickness corresponding to an optical length, and epitaxially growing the layers of p-InGaAsP and p-InP by turns to form 10.5 pairs thereof to form the p-InP/InGaAsP reflection layer 852.

Then the obtained structure is further subjected to the following steps of treating a surface of the epitaxial layer on the GaAs substrate with HF and treating a surface of the epitaxial layer on the InP substrate with HF and a solution of $H_2SO_4:H_2O_2:H_2O$ (3:1) to remove a naturally oxidized film; bringing these surfaces into intimate contact with each other; and subjecting in a hydrogen atmosphere to anneal at 600° C. for 1 hour, followed by removing the InP substrate using a solution of $HCl:H_2PO_4$ (3:1).

Then $SiO_2$ circular patterns of 5 μm in diameter are formed by the step of photolithography. In addition, the n-InGaAsP/InP reflection layer 852 is subjected to a reactive ion beam etching (RIBE) using a gas of the mixture of ethane ($C_2H_2$) and hydrogen to etch into the InP layer under the active layer, and then the InP layer is etched by HCl. Subsequently, the InGaAsP layer is etched down to a surface of the InP layer. After that, the Fe-doped InP layer 856 and the n-type InP layer are grown in order. After removing the $SiO_2$ mask by treating with BHF, The n-type electrodes 860 are formed on the top of the InP layers, respectively, and also the $SiO2/TiO_2$ dielectric multi-layered film is subsequently prepared by evaporation. Meanwhile, p-type electrodes 858 are formed on the underside of the GaAs substrate by evaporation, and then a AR coat layers 859 are formed on the underside thereof to be used as an output portion.

The light-current characteristics of the VCSEL obtained by the above process revealed that the laser was oscillated at the threshold current of 0.9 mA. In this case, furthermore, up to 10 mA, the device showed a single transverse mode.

In the above embodiment, the bulk of InGaAsP was used as the active layer but not limited thereto. The same effects can be attained by providing a strained MQW active layer or a non-strained MQW active layer made of InGaAsP/InGaAs. In the above embodiment, furthermore, each of the reflection layers is provided as a multi-layered film. However, one of these reflection layers may be a dielectric multi-layered film.

In the above embodiment, furthermore, the bulk of InGaAsP was used as the active layer but not limited thereto. The same effects can be attained by providing a strained layer MQW active layer or a non-strained MQW active layer made of InGaAsP/InGaAs.

8th Embodiment

Figure 20:
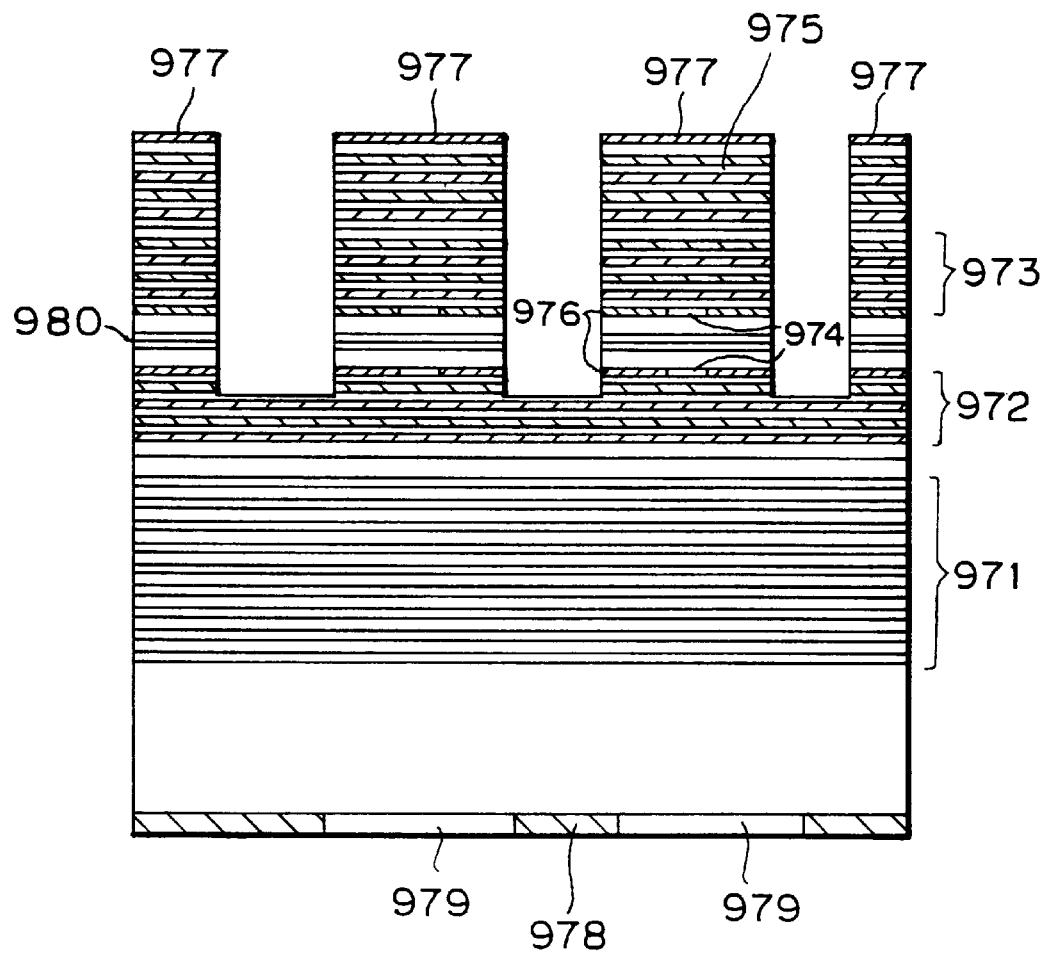
FIG. 20 is a schematic sectional view of an eighth preferred embodiment of the long-wavelength VCSELs in accordance with the present invention.

FIG. 20 is a schematic cross sectional view of the eighth embodiment of the vertical-cavity surface-emitting laser (VCSEL) in accordance with the present invention. As shown in the figure, the device comprises a p-GaAs/AlAs reflector 971, a p-InP/InGaAsP reflector 972, a InGaAsP bulk active layer 980, a n-InP/InGaAsP reflector 973, an InAlAs layer 974, a GaAs/AlAs layer 975, an InAlAs oxidized layer 976, a n-type contact 977, a p-type contact 978, and an anti-reflection (AR) coat film 979.

The VCSEL is manufactured by the process including the following steps. At first, the layers of AlAs and GaAs are epitaxially grown by turns to form 25 pairs thereof on a p-type GaAs substrate, in which each layer has a thickness corresponding to a quarter of 1.55 μm optical length, to form the p-GaAs/AlAs reflection layer 971. On the other hand, the layers of n-InGaAsP and n-InP are epitaxially grown by turns to form 9 pairs thereof on a InP substrate, in which each layer has a thickness of a quarter of 1.55 μm optical length, to form the n-InP/InGaAsP reflector 953. In addition, an InGaAsP bulk active layer 980 with a thickness corresponding to a 1.55 μm optical length is formed, and also the layers of p-InAlAs and p-InGaAsP are grown to form one pair thereof as the InAlAs layer 974. Furthermore, the layers of p-InP and p-InGaAsP are epitaxially grown by turns to form 9.5 pairs thereof to form the p-InP/InGaksP reflector 972.

Then the obtained structure is further subjected to the following steps of treating a surface of the epitaxial layer on the GaAs substrate with HF and treating a surface of the epitaxial layer on the InP substrate with solutions of HF and $H_2SO_4:H_2O_2:H_2O$ (3:1) to remove a naturally oxidized film, bringing these surfaces into intimate contact with each other and subjecting in a hydrogen atmosphere to anneal at 600° C. for 1 hour, followed by removing the InP substrate using a solution of $HCl:H_2PO_4$ (3:1).

Furthermore, the InGaAsP layer as a stop-etching layer is etched by $H_2SO_4:H_2O_2:H_2O$ (3:1) etchant, and then n-GaAs/AlAs layer 975 is formed by epitaxially growing AlAs and GaAs layers on a GaAs substrate in alternating manner to make a stack of 20 pairs of the layers in which each of them has a thickness corresponding to a quarter of 1.55 μm optical length.

Then the obtained structure is further subjected to the following steps of treating a surface of the epitaxial layer on the GaAs substrate with HF and treating a surface of the epitaxial layer on the InP substrate with solutions of HF and $H_2SO_4:H_2O_2:H_2O$ (3:1) to remove a naturally oxidized film, bringing these surfaces into intimate contact with each other and subjecting in a hydrogen atmosphere to anneal at 600° C. for 1 hour, followed by removing the GaAs substrate using a solution of $HCl:H_2PO_4$ (3:1).

Furthermore, $SiO_2$ circular patterns of 5 μm in diameter are formed by the step of photolithography. Then, a reactive ion beam etching (RIBE) is performed using a gas of the mixture of argon and chloride to etch into the InGaAsP/InP layer under the active layer. After that, a current crowding region (InAlAs oxidized layer) 976 is formed by laterally oxidizing the InAlAs in a water vapor at a temperature of 525° C. After removing the SiO2 mask by treating with BHF, the n-type electrodes 977 are formed, while p-type electrodes 978 are formed on the underside of the GaAs substrate. Then AR coat layers 979 are formed on the underside thereof to be used as an output portion.

The light-current characteristics of the VCSEL obtained by the above process revealed that the laser was oscillated at the threshold current of 0.6 mA.

In this embodiment, by the way, it is possible to form a thin cladding layer between the active layer and the InGaAsP/InP reflection layer on each side of the active layer. The cladding layer may be made of InGaAsP or InP with an appropriate thickness.

According to the present invention, as described in the above embodiments, wafer-fusion interfaces can be formed between the reflection layers of the first and second semiconductor multi-layered films and between the reflection layers of the third and fourth semiconductor multi-layered films, respectively, which are arranged on the upper or under side of the active layer. This fact allows a longer distance between the active layer and each of the fusion-interfaces without increasing a resonant cavity length, resulting in good crystallinity of the active layer. Then, a threshold current becomes low.

The active layer can be grown on the same substrate together with the second and third reflection layers, so that it allows a measurement of oscillation wavelength before fusing the emission region with the substrate having the first or fourth reflection layer thereon. In addition, there is provided the InGaAsP based semiconductor multi-layered structure under the active layer, so that it becomes possible to increase an acceptable depth of etching at the time of forming the buried hetero-structure and also it can be performed in conjunction with a selectable chemical etching. As a result, the etching depth can be easily regulated uniformly and it becomes possible to increase the yields at the time of forming the buried hetero-structure, dramatically. Therefore, the VCSEL can emit at a single transverse mode light under the condition of high-carrier injection density.

In the above embodiment, the bulk of InGaAsP was used as the active layer but not limited to. The same effects can be attained by providing a strained layer MQW active layer or a non-strained MQW active layer made of InGaAsP/InGaAs.

The present invention has been described in detail with respect to preferred embodiments, and it will be known that changes and modifications may be made without departing from the invention in its broader aspects, and it is the intention, therefore, in the appended claims to cover all such changes and modifications as fall within true spirit of the invention.

What is claimed is:

1. A method of manufacturing a vertical-cavity surface-emitting semiconductor laser, comprising the steps of:

growing a first semiconductor multi-layered film on a first GaAs substrate;

growing a second semiconductor multi-layered film, an active layer, and a third semiconductor multi-layered film on an InP substrate in that order;

growing a fourth semiconductor multi-layered film on a second GaAs substrate in that order;

fusing said first semiconductor multi-layered film with said second semiconductor multi-layered film under heat and pressure, followed by removing said InP substrate; and fusing said third semiconductor multi-layered film with said fourth semiconductor multi-layered film under heat and pressure, followed by removing said second GaAs substrate, wherein said first semiconductor multi-layered film is formed by piling up a plurality of $Al_{x1}Ga_{1-x1}As$ layers ($0 \leq x1 \leq 1$) and a plurality of $Al_{x2}Ga_{1-x2}As$ layers ($0 \leq x2 \leq 1$) one after the other by turns, in which each layer has a thickness corresponding to a value obtained by dividing an emission wavelength by a refractive index and 4;

said second semiconductor multi-layered film is formed by piling up a plurality of $In_{x3}Ga_{1-x3}As_{y3}P_{1-y3}$ layers ($0 \leq x3, y3 \leq 1$) and a plurality of $In_{x4}Ga_{1-x4}As_{y4}P_{1-y4}$ layers ($0 \leq x4, y4 \leq 1$) one after the other by turns, in which each layer has a thickness corresponding to a value obtained by dividing an emission wavelength by a refractive index and 4;

said active layer is formed at least from an $In_{x5}Ga_{1-x5}As_{y5}P_{1-y5}$ layer ($0 \leq x5, y5 \leq 1$);

said third semiconductor multi-layered film is formed by piling up a plurality of $In_{x6}Ga_{1-x6}As_{y6}P_{1-y6}$ layers ($0 \leq x6, y6 \leq 1$) and a plurality of $In_{x7}Ga_{1-x7}As_{y7}P_{1-y7}$ layers ($0 \leq x7, y7 \leq 1$) one after the other by turns, in which each layer has a thickness corresponding to a value obtained by dividing an emission wavelength by a refractive index and 4; and said fourth semiconductor multi-layered film is formed by piling up a plurality of $Al_{x8}Ga_{1-x8}As$ layers ($0 \leq x8 \leq 1$) and a plurality of $Al_{x9}Ga_{1-x9}As$ layers ($0 \leq x9 \leq 1$) one after the other by turns, in which each layer has a thickness corresponding to a value obtained by dividing an emission wavelength by a refractive index and 4.

2. A method as claimed in claim 1, wherein said step of growing said first semiconductor multi-layered film on said GaAs substrate further includes a step of forming an $Al_{x10}Ga_{1-x10}As$ layer ($0 \leq x10 \leq 1$) between said $Al_{x1}Ga_{1-x1}As$ layer and said $Al_{x2}Ga_{1-x2}As$ layer, in which said $Al_{x10}Ga_{1-x10}As$ layer is thinner than said $Al_{x1}Ga_{1-x1}As$ layer and said $Al_{x2}Ga_{1-x2}As$ layer.

3. A method as claimed in claim 1, wherein said step of growing said fourth semiconductor multi-layered film on said second GaAs substrate further includes a step of forming a $Al_{x11}Ga_{1-x11}As$ layer ($0 \leq x11 \leq 1$) between said $Al_{x8}Ga_{1-x8}As$ layer and said $Al_{x8}Ga_{1-x8}As$ layer, in which said $Al_{x11}Ga_{1-x11}As$ layer is thinner than said $Al_{x8}Ga_{1-x8}As$ layer and said $Al_{x8}Ga_{1-x8}As$ layer.

4. A method as claimed in claim 1, wherein prior to remove said InP substrate, at least one high-resistance portion as an insulation layer is formed in at least one selected from a group of said second semiconductor multi-layered film and said third semiconductor multi-layered film by an ion-injection.

5. A method as claimed in claim 1, wherein prior to fuse said third semiconductor multi-layered film with said fourth semiconductor multi-layered film, at least one conductive portion as a conductive layer is formed in each of said second semiconductor multi-layered film and said second semiconductor multi-layered film by an ion-injection.

6. A method as claimed in claim 1, wherein after removing said second GaAs substrate, a mesa structure is formed by etching down from said fourth semiconductor multi-layered film to a predetermined point of said second semiconductor multi-layered film; and a buried hetero-structure is formed on said mesa structure by growing a semiconductor selected from a group of InP and other semiconductors that have lattice constants matching with that of InP.

7. A method as claimed in claim 1, wherein prior to remove said InP substrate, a first $In_{x12}Al_{x13}Ga_{1-x12-x13}As$ layer ($0 \leq x12, x13 \leq 1$) is formed between said second semiconductor multi-layered film and said active layer and a second $In_{x12}Al_{x13}Ga_{1-x12-x13}As$ layer ($0 \leq x12, x13 \leq 1$) is formed between said third semiconductor multi-layered film and said active layer, and after forming a mesa structure, an oxidized portion is formed in said first and second $In_{x12}Al_{x13}Ga_{1-x12-x13}As$ layers.

8. A method as claimed in claim 1, wherein a cladding layer consisting of $In_{x14}Ga_{1-x14}As_{1-y14}P_{1-y14}$ ($0 \leq x14, y14 \leq 1$) is formed at least one interface selected from a group of an interface between said active layer and said first semiconductor multi-layered film and an interface between said active layer and said second semiconductor multi-layered film.

* * * * *